US012406936B2

(12) United States Patent
Yew et al.

(10) Patent No.: US 12,406,936 B2
(45) Date of Patent: Sep. 2, 2025

(54) SEMICONDUCTOR PACKAGE WITH SUBSTRATE RECESS AND METHODS FOR FORMING THE SAME

(71) Applicant: Taiwan Semiconductor Manufacturing Company Limited, Hsinchu (TW)

(72) Inventors: Ming-Chih Yew, Hsinchu (TW); Shu-Shen Yeh, Taoyuan (TW); Yu-Sheng Lin, Zhubei (TW); Po-Yao Lin, Zhudong Township (TW); Shin-Puu Jeng, Po-Shan Village (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 246 days.

(21) Appl. No.: 17/829,552

(22) Filed: Jun. 1, 2022

(65) Prior Publication Data

US 2023/0395519 A1 Dec. 7, 2023

(51) Int. Cl.
| | |
|---|---|
| *H01L 23/538* | (2006.01) |
| *H01L 23/31* | (2006.01) |
| *H01L 23/498* | (2006.01) |
| *H01L 25/00* | (2006.01) |
| *H01L 25/18* | (2023.01) |
| *H01L 23/00* | (2006.01) |

(52) U.S. Cl.
CPC ...... *H01L 23/5389* (2013.01); *H01L 23/3121* (2013.01); *H01L 23/49811* (2013.01); *H01L 23/5383* (2013.01); *H01L 23/5385* (2013.01); *H01L 23/5386* (2013.01); *H01L 25/18* (2013.01); *H01L 25/50* (2013.01); *H01L 24/13* (2013.01); *H01L 24/16* (2013.01); *H01L 2224/13111* (2013.01); *H01L 2224/13147* (2013.01); *H01L 2224/13155* (2013.01); *H01L 2224/16227* (2013.01)

(58) Field of Classification Search
None
See application file for complete search history.

(56) References Cited

U.S. PATENT DOCUMENTS

| | | | | |
|---|---|---|---|---|
| 12,125,755 | B2 * | 10/2024 | Jeng | H01L 24/17 |
| 2018/0315740 | A1 * | 11/2018 | Im | H01L 21/6836 |
| 2021/0074600 | A1 * | 3/2021 | Jeng | H01L 21/486 |
| 2023/0369150 | A1 * | 11/2023 | Jeng | H01L 25/50 |

* cited by examiner

*Primary Examiner* — Long Pham
(74) *Attorney, Agent, or Firm* — The Marbury Law Group, PLLC

(57) ABSTRACT

Semiconductor packages and methods of fabricating semiconductor packages include a package substrate having a recess formed in a surface of the package substrate and at least one channel in a bottom surface of the recess. The recess may be configured to accommodate a semiconductor device located over a surface of an interposer that is bonded to the package substrate. Accordingly, a minimum gap distance may be maintained between the semiconductor device and the package substrate, which may ensure that sufficient underfill material may flow between the semiconductor device and the package substrate and within the at least one channel, thereby improving of the structural coupling between the interposer and the package substrate, and reducing the likelihood of package defects, such as delamination, cracking, and/or popcorn defects.

20 Claims, 16 Drawing Sheets

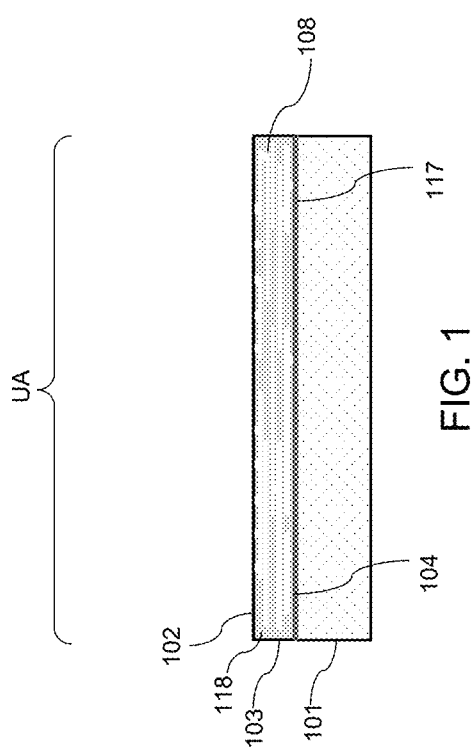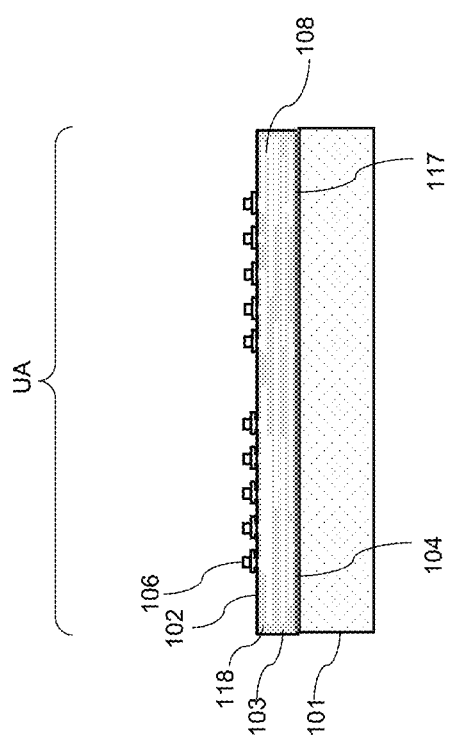

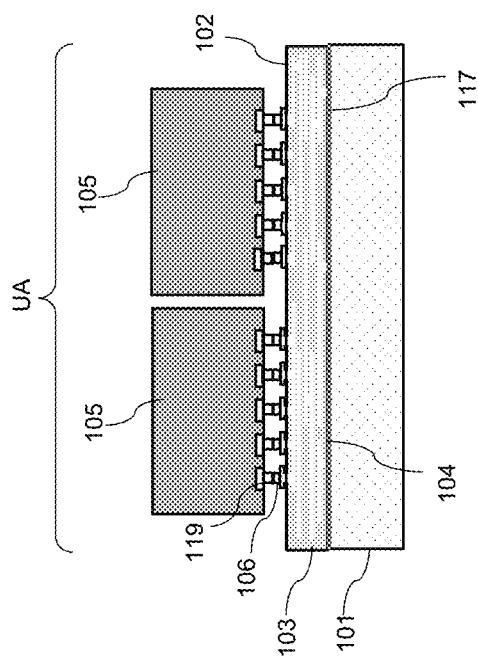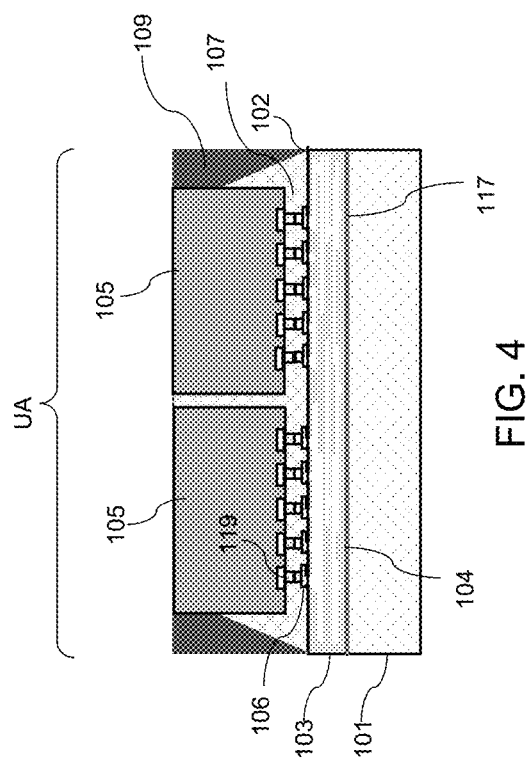

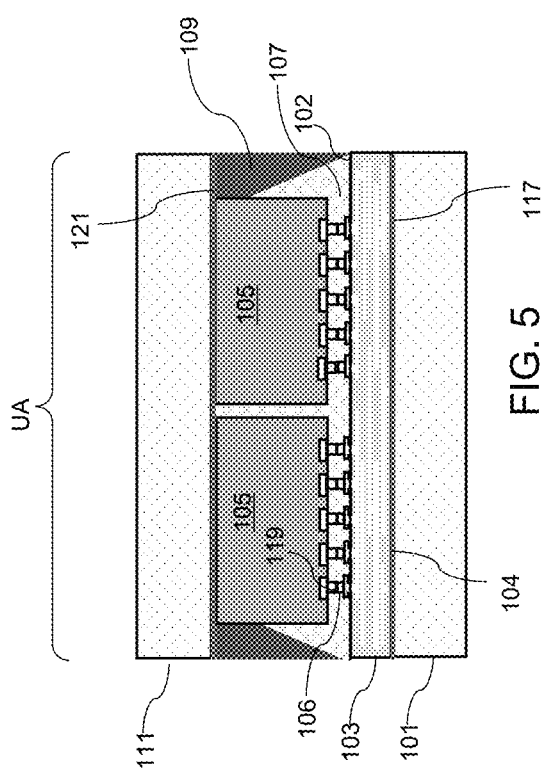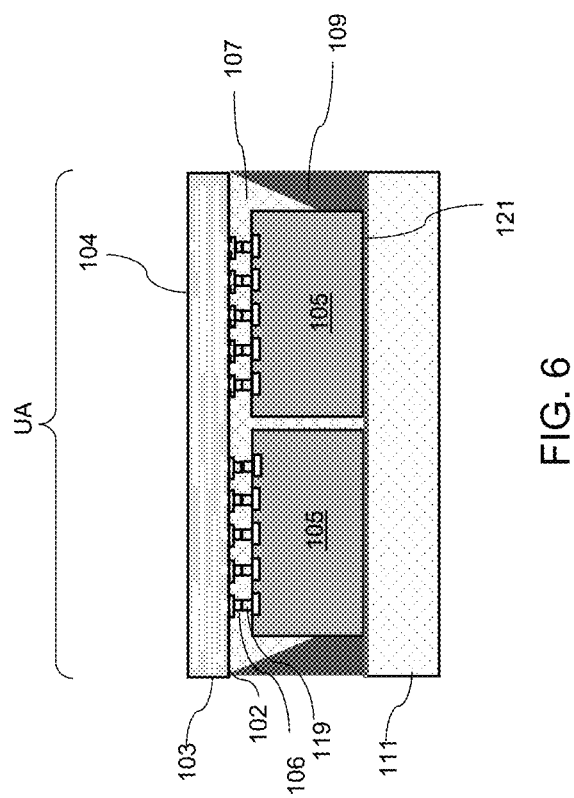

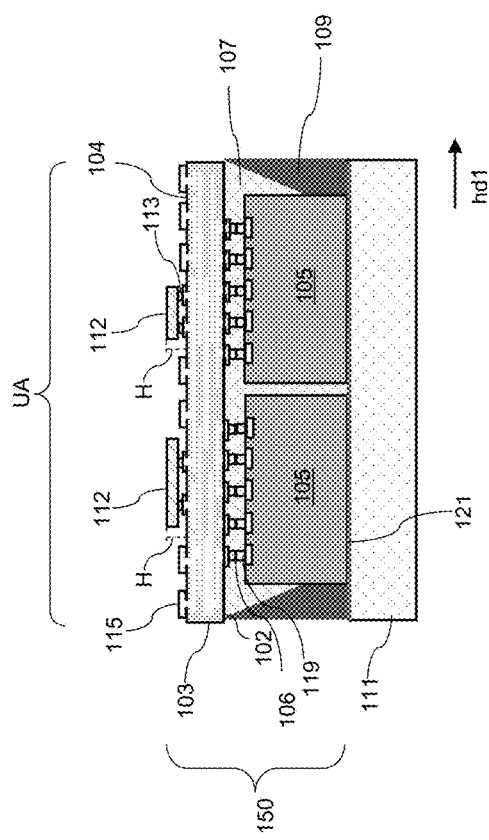
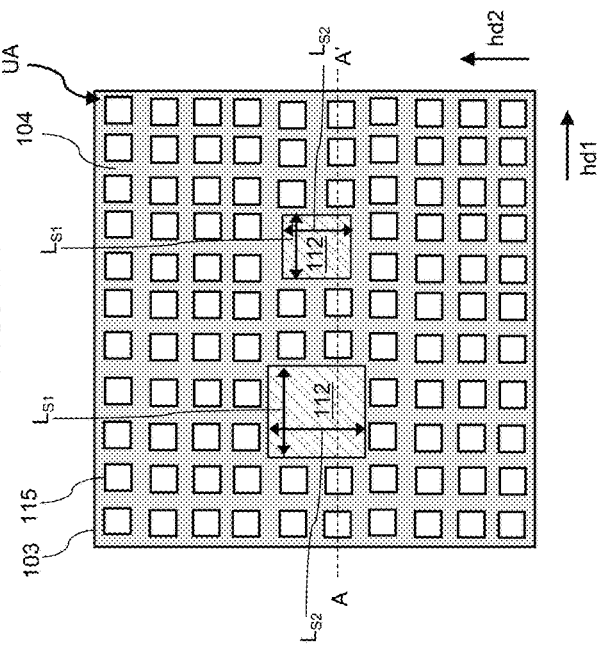
FIG. 7A
FIG. 7B

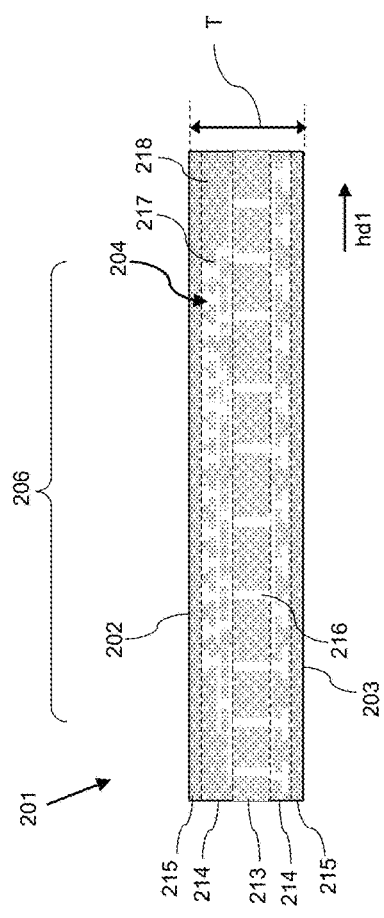
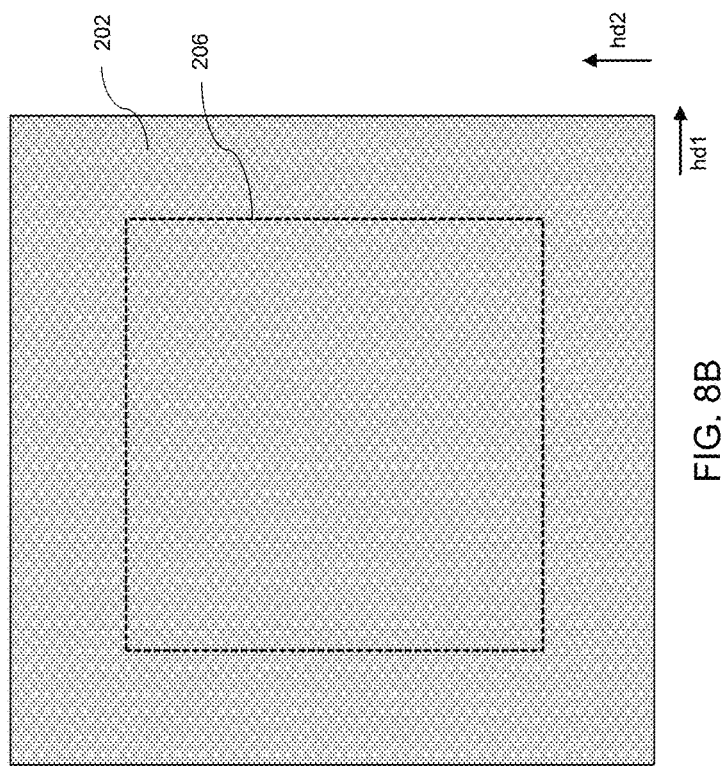

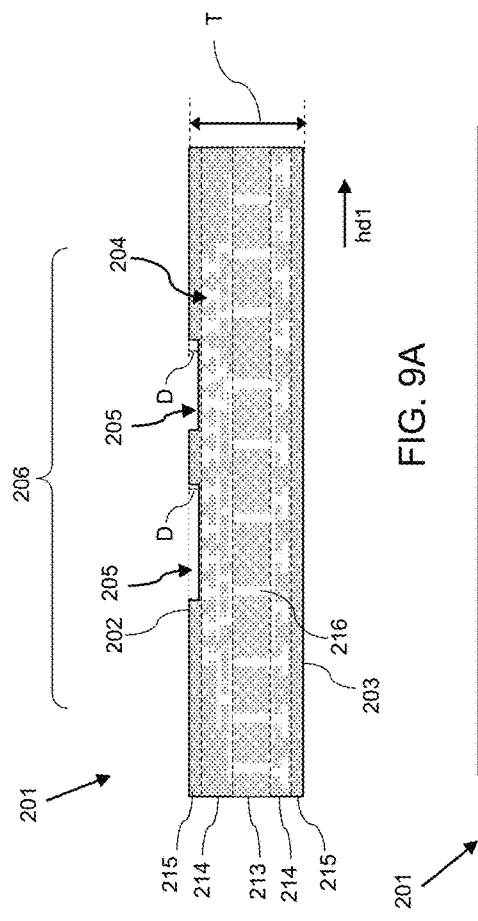
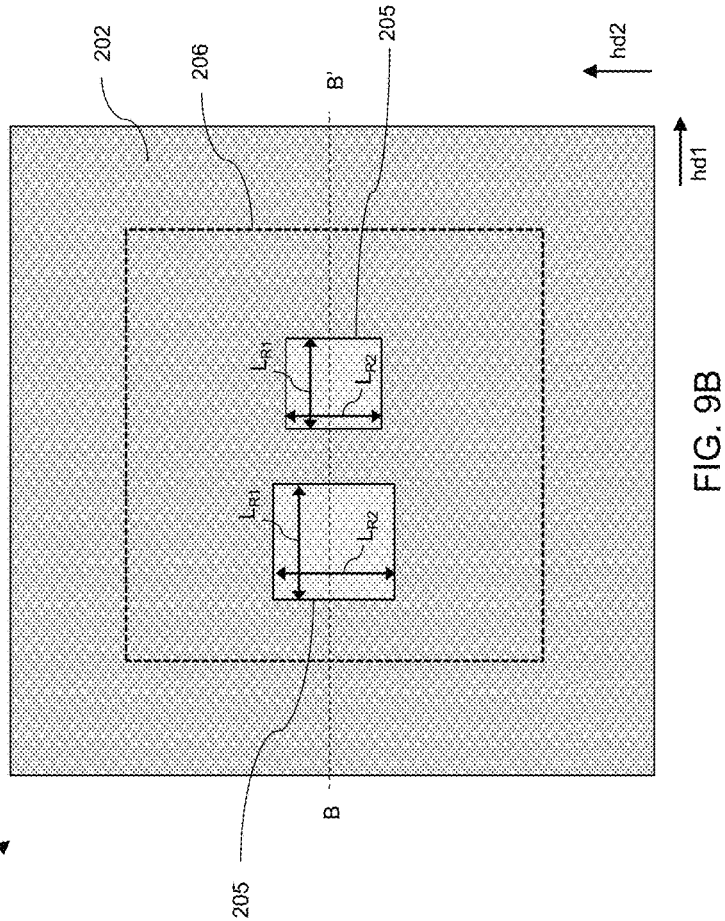

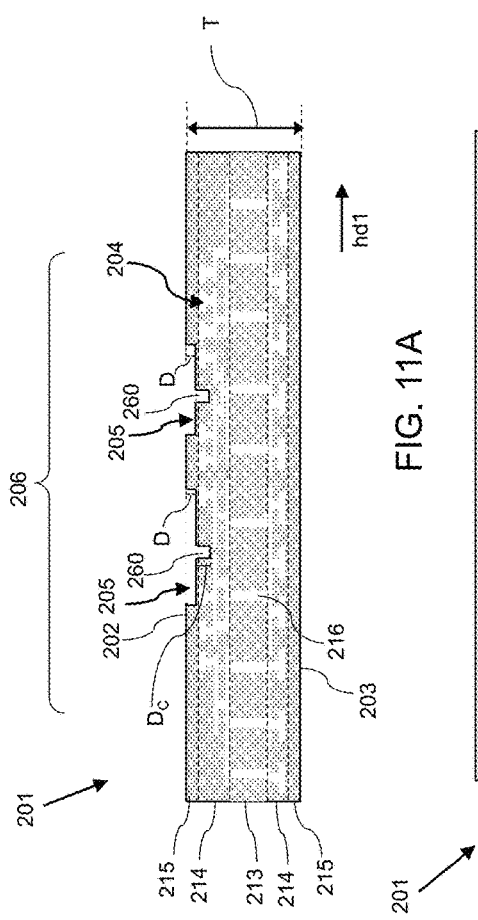
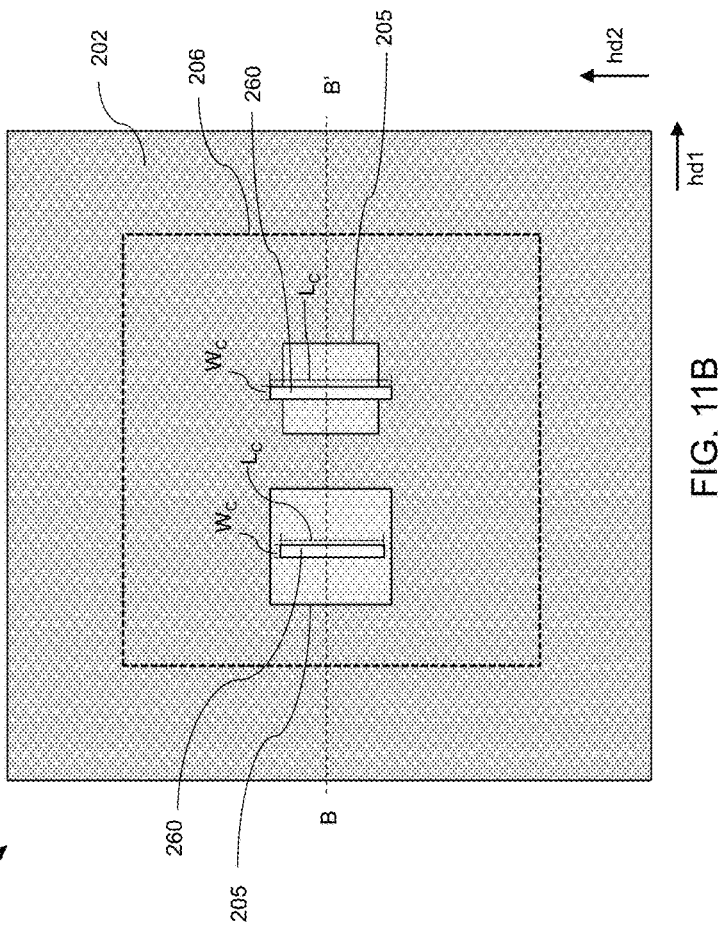

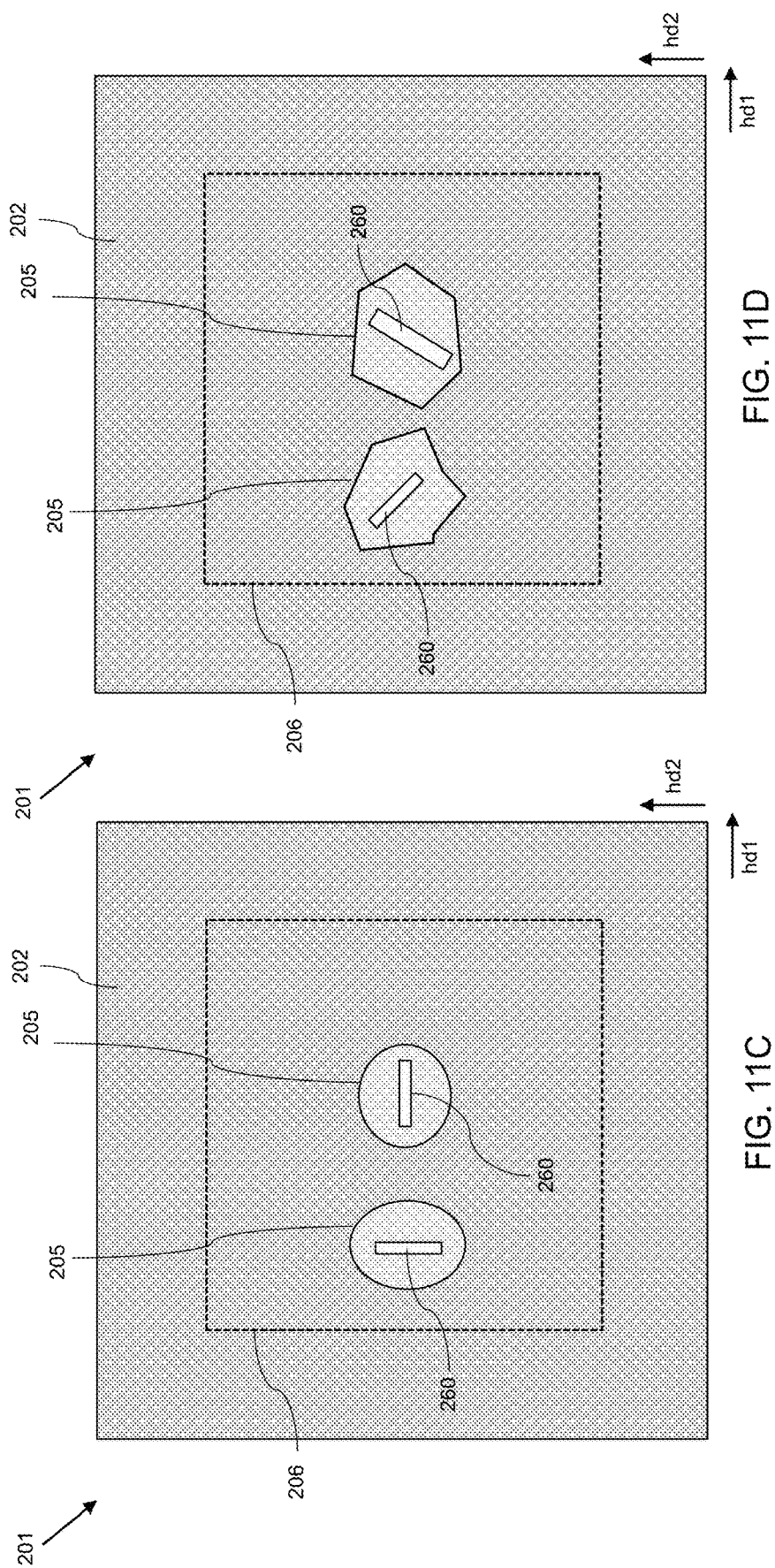

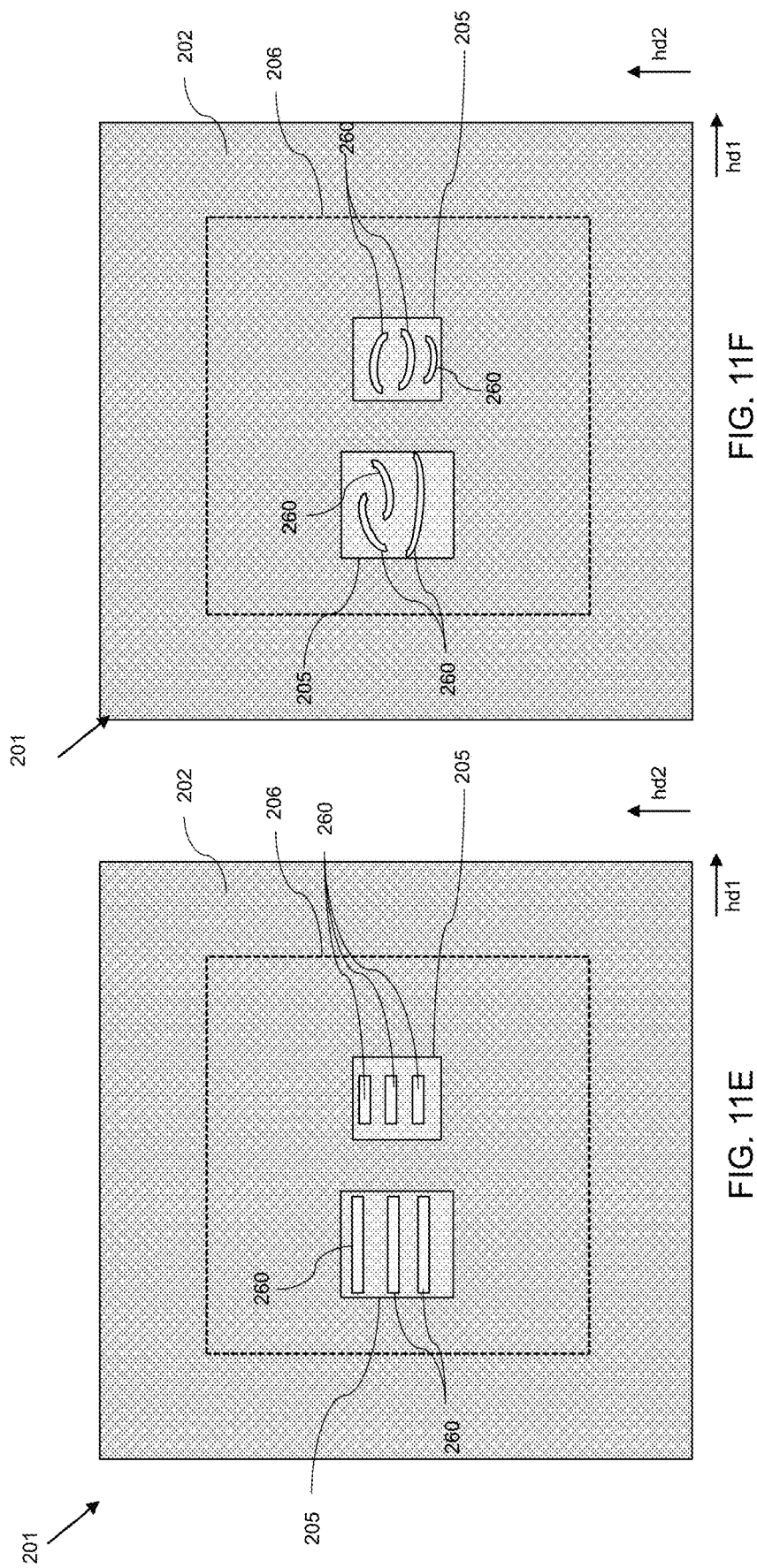

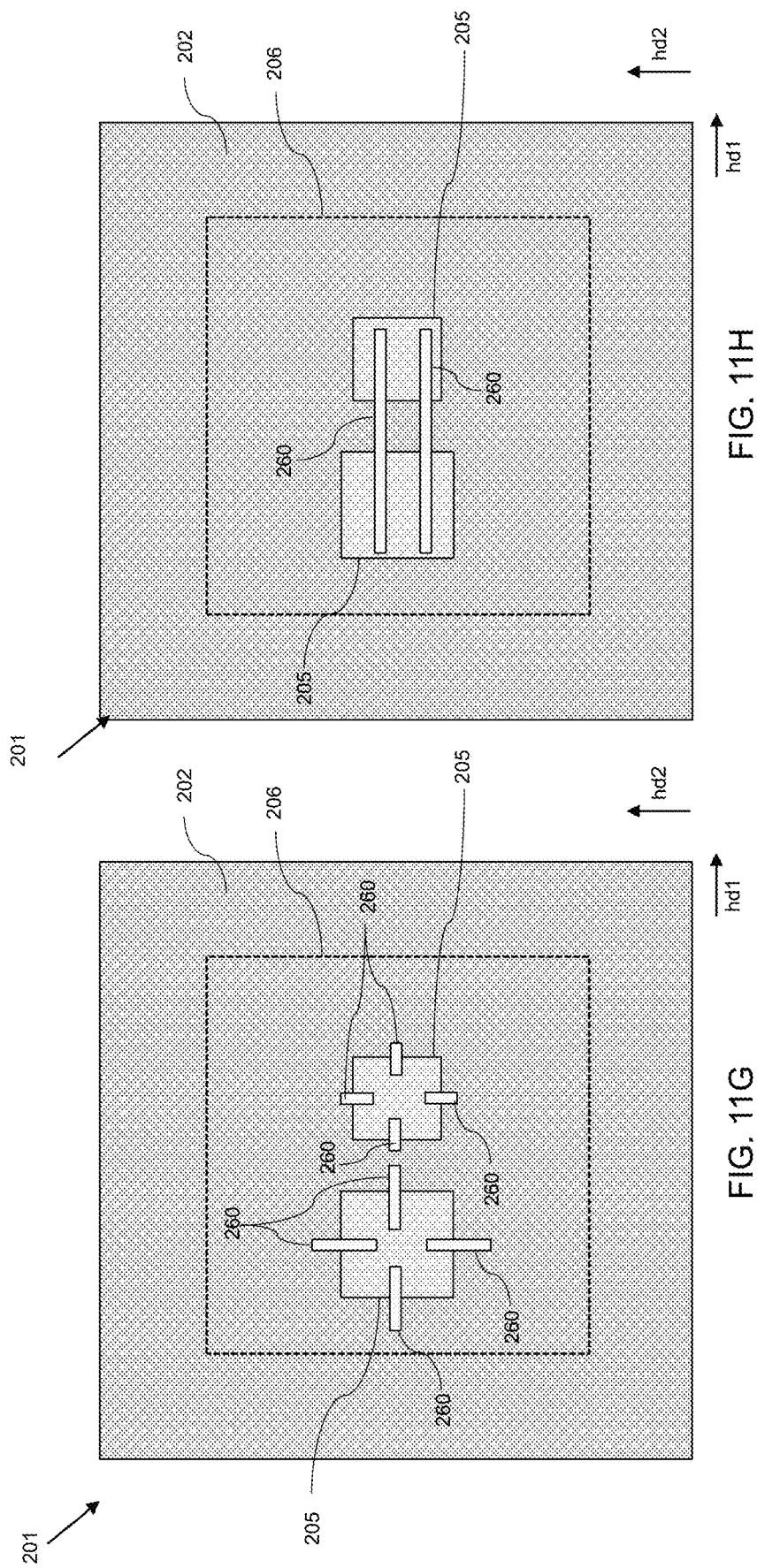

SEMICONDUCTOR PACKAGE WITH SUBSTRATE RECESS AND METHODS FOR FORMING THE SAME

BACKGROUND

Semiconductor devices are used in a variety of electronic applications. Some examples may include personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer, and individual dies on the wafer are singulated by sawing between the integrated circuits along a scribe line. The individual dies are typically packaged separately, for example, in multi-chip modules, or in other types of packaging.

As semiconductor packages have become more complex, ensuring mechanical integrity of the package has become more difficult. Package defects, such as delamination, cracking and other defects, may negatively affect package yields and device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a vertical cross-section view of an exemplary intermediate structure during a process of forming a semiconductor package including an organic interposer located over a first carrier substrate according to various embodiments of the present disclosure.

FIG. 2 is a vertical cross-section view of the exemplary intermediate structure showing bonding structures located over the first side surface of the interposer according to various embodiments of the present disclosure.

FIG. 3 is a vertical cross-section view of the exemplary intermediate structure showing a plurality of semiconductor integrated circuit (IC) dies mounted over the first side surface of the interposer according to various embodiments of the present disclosure.

FIG. 4 is a vertical cross-section view of the exemplary intermediate structure showing a first underfill material portion located between the lower surfaces of the semiconductor IC dies and the first side surface of the interposer, and a molding portion around the outer periphery of the plurality of semiconductor IC dies according to various embodiments of the present disclosure.

FIG. 5 is a vertical cross-section view of the exemplary intermediate structure showing a second release layer located over the upper surfaces of the plurality of semiconductor dies, the exposed upper surface of the first underfill material portion and the exposed upper surface of the molding portion, and a second carrier substrate over the second release layer according to various embodiments of the present disclosure.

FIG. 6 is a vertical cross-section view of the exemplary intermediate structure showing the first carrier substrate removed according to various embodiments of the present disclosure.

FIG. 7A is a vertical cross-section view of the exemplary intermediate structure showing a plurality of bonding pads and semiconductor devices located over the second side surface of the interposer according to various embodiments of the present disclosure.

FIG. 7B is a top view of the exemplary intermediate structure of FIG. 7A.

FIG. 8A is a vertical cross-section view of a package substrate according to various embodiments of the present disclosure.

FIG. 8B is a top view of the package substrate of FIG. 8A.

FIG. 9A is a vertical cross-section view of the package substrate showing a plurality of recesses formed in the first side surface of the package substrate according to various embodiments of the present disclosure.

FIG. 9B is a top view of the package substrate of FIG. 9A.

FIG. 11A is a vertical cross-section view of the package substrate showing a channel formed in the bottom surface of each of the recesses according to an embodiment of the present disclosure.

FIG. 11B is a top view of the package substrate of FIG. 11A.

FIG. 11C is a top view of an alternative embodiment package substrate of FIG. 11A.

FIG. 11D is a top view of another alternative embodiment of the package substrate of FIG. 11A.

FIG. 11E is a top view of another alternative embodiment of the package substrate of FIG. 11A.

FIG. 11F is a top view of another alternative embodiment of the package substrate of FIG. 11A.

FIG. 11G is a top view of another alternative embodiment of the package substrate of FIG. 11A.

FIG. 11H is a top view of another alternative embodiment of the package substrate of FIG. 11A.

DETAILED DESCRIPTION

Figure 9D:
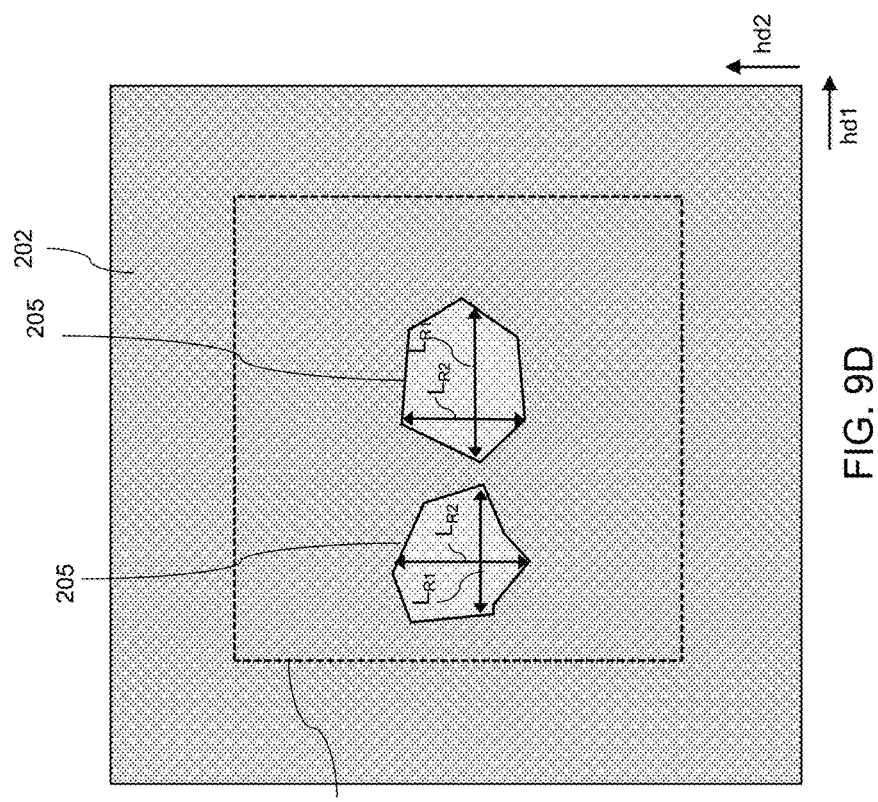
FIG. 9D is a top view of another alternative embodiment of the package substrate of FIG. 9A.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Various embodiments disclosed herein may be directed to semiconductor devices, and in particular to semiconductor packages and methods of fabricating semiconductor packages having a package substrate that may include one or more recesses in a surface of the package substrate.

Typically, in a semiconductor package a number of semiconductor integrated circuit (IC) dies (i.e., "chips") may be mounted onto a common substrate, which may also be referred to as a "package substrate." In some packages, such as in a fan out wafer level package (FOWLP) and/or fan-out panel level package (FOPLP), a plurality of semiconductor IC dies may be mounted to an interposer, such as an organic interposer or a semiconductor (e.g., silicon) interposer, that may include interconnect structures extending therethrough. The resulting package structure, including the interposer and the semiconductor IC dies mounted thereon, may then be mounted onto a surface of a package substrate using solder connections. An underfill material portion may be provided in the space between the interposer and the package substrate to encapsulate the solder connections and improve the structural coupling between the interposer and the package substrate.

In order to improve electrical performance of the package, some package designs may include additional structures located between the interfacing surfaces of the interposer and the package substrate. For example, one or more semiconductor devices, which may be composed of silicon, may be located over portions of the surface of the interposer that is mounted to the package substrate. In some embodiments, the semiconductor devices may function as a capacitor and may help to improve the signal integrity of the active IC devices of the package. However, the presence of these structures between the interposer and the package substrate may negatively affect the integrity of the structural coupling between the interposer and the package substrate.

In particular, in instances in which a semiconductor device located over the surface of the interposer contacts the package substrate, or in instances when the gap between the semiconductor device and the package substrate is too small to permit adequate flow of the underfill material between the semiconductor device and the package substrate, void areas may be present in the underfill material portion between the interposer and the package substrate. These void areas may lead to package defects, such as delamination of the interposer from the package substrate, cracking of the underfill material portion, and/or moisture-induced "popcorn" defects, which may negatively effect package yields and performance.

Various embodiments disclosed herein include semiconductor packages and methods of fabricating semiconductor packages utilizing a package substrate having one or more recesses formed in a surface of the package substrate and at least one channel in a bottom surface of each of the recesses. Each of the recesses formed in the surface of the package substrate may be configured to accommodate a semiconductor device located over a surface of an interposer that may be bonded to the package substrate. Accordingly, a minimum gap distance may be maintained between the semiconductor device and the package substrate. The minimum gap distance may encourage sufficient underfill material to flow between the semiconductor device and the package substrate and within the at least one channel formed in the bottom surface of each of the recesses. This may improve the integrity of the structural coupling between the interposer and the package substrate, and may significantly reduce the likelihood of package defects, such as delamination, cracking, and/or popcorn defects, thereby improving package yields and performance.

FIG. 1 is a vertical cross-section view of an exemplary intermediate structure during a process of forming a semiconductor package according to various embodiments of the present disclosure. Referring to FIG. 1, the exemplary intermediate structure includes a first carrier substrate 101 and an interposer 103 formed and mounted over a front side surface of the first carrier substrate 101. The first carrier substrate 101 may provide mechanical support to the interposer 103, and may be formed of a suitable substrate material, such as glass material, a ceramic material (e.g., a sapphire substrate), a semiconductor material (e.g., a silicon substrate), or the like. Other suitable materials for the first carrier substrate 101 are within the contemplated scope of disclosure. In some embodiments, the first carrier substrate 101 may be formed of an optically transparent material.

In some embodiments, a first release layer 117 may be located over the front side surface of the first carrier substrate 101, and the interposer 103 may be located over the first release layer 117. The first release layer 117 may include an adhesive material that may adhere the interposer 103 to the front side surface of the first carrier substrate 101. In some embodiments, the first release layer 117 may include an adhesive material that may be subsequently treated to cause the adhesive material of the first release layer 117 lose its adhesive properties, such that the first carrier substrate 101 may be separated from the interposer 103. In some embodiments, the adhesive material of the first release layer 117 may lose its adhesive properties when subjected to treatment using an energy source, such as a thermal, optical (e.g., UV, laser, etc.) and/or sonic (e.g., ultrasonic) energy source. In one non-limiting example, the first release layer 117 may include a light-to-heat conversion (LTHC) material that may selectively absorb optical radiation in certain wavelength range(s), such as ultraviolet radiation, causing the LTHC material to heat up and thereby lose adhesion. In other embodiments in which the first carrier substrate 101 is formed of an optically transparent material, the application of an optical energy source may cause the first release layer 117 to lose its adhesive property. Alternatively, the first release layer 117 may include an adhesive material, such as an acrylic pressure-sensitive adhesive material, that may decompose when subjected to an elevated temperature. Other suitable materials for the first release layer 117 are within the contemplated scope of disclosure.

Referring again to FIG. 1, the interposer 103 may include a first side surface 102 and a second side surface 104 opposite the first surface 103. The second side surface 104 of the interposer 103 may face the front side surface of the first carrier substrate 101. A plurality of conductive interconnect structures 108 (e.g., metal lines and vias) may extend within the interposer 103 between the first side surface 102 and the second side surface 104 of the interposer 103. The conductive interconnect structures 108 may be formed in and surrounded by an insulating matrix that may be formed of a dielectric material 118. The conductive interconnect structures 108 of the interposer 103 may be configured to route electrical signals between semiconductor integrated circuit (IC) dies and a package substrate in a semiconductor package to be subsequently formed. Thus, the conductive interconnect structures 108 of the interposer 103 may also be referred to as "redistribution structures."

In some embodiments, the interposer 103 may be an organic interposer. The organic interposer 103 may be formed on the first carrier substrate 101. In one non-limiting example, the interposer 103 may be formed by sequentially depositing layers of a dielectric material 118, such as a dielectric polymer material, over the front side surface of the first carrier substrate 101 (and over the first release layer 117, if present). Each of the layers of dielectric material 118 may be lithographically patterned and etched to form open regions (e.g., trenches and/or via openings), and a metallization process may then be used to fill the open regions and form conductive interconnect structures 108 (e.g., metal lines and vias) within each successive layer of dielectric material 118. In this manner, the interposer 103 may be built layer-by-layer over the front side surface of the first carrier substrate 101.

In some embodiments, each of the layers of dielectric material 118 of the interposer 103 may include a suitable dielectric polymer material, such as polyimide (PI), benzocyclobutene (BCB), or polybenzobisoxazole (PBO). Other suitable dielectric materials are within the contemplated scope of disclosure. The layers of dielectric material 118 of the interposer 103 may be formed using a suitable deposition process, such as a spin coating and drying process. Other suitable deposition processes are within the contemplated scope of disclosure.

The conductive interconnect structures 108 of the interposer 103 may be formed of a suitable conductive material, such as Cu, Ni, W, Cu, Co, Mo, Ru, etc., including alloys and combinations of the same. In some embodiments, the conductive interconnect structures 108 may include a metallic barrier layer, such as a layer of Ti, TiN, TaN, or WN, contacting the dielectric material 118, and a metallic fill material, which may include an elemental metal (e.g., Cu, Ni, etc.) or an alloy or a combination thereof. Other suitable materials for the conductive interconnect structures 108 of the interposer 103 are within the contemplated scope of disclosure. The conductive interconnect structures 108 of the interposer 103 may be formed using any suitable deposition process. For example, suitable deposition processes may include physical vapor deposition (PVD), sputtering, chemical vapor deposition (CVD), atomic layer deposition (ALD), plasma-enhanced chemical vapor deposition (PECVD), electrochemical deposition (e.g., electroplating), or combinations thereof.

Referring again to FIG. 1, an instance of an interposer 103 located over the front side surface of the first carrier substrate 101 may be referred to as a unit area (UA) of the first carrier substate 101. A single unit area (UA) is illustrated in FIG. 1, although it will be understood that the first carrier substrate 101 may include a plurality of unit areas (UAs), where each unit area (UA) may include a separate instance of an interposer 103 over the front side surface of the first carrier substrate 101. For example, the first carrier substrate 101 may include a periodic two-dimensional array (such as a rectangular array) of unit areas (UAs), where each unit area (UA) of the array may include a separate instance of an interposer 103 over the front side surface of the carrier substrate 101. In some embodiments, each interposer 103 within a unit area (UA) of the array may have an identical structure. The plurality of interposers 103 over the first carrier substrate 101 may be continuous with one another, such that a continuous layer of dielectric material 118 may extend over the front side surface of the first carrier substrate 101, with separate instances of conductive interconnect structures 108 formed within the continuous layer of dielectric material 118 in each unit area (UA).

FIG. 2 is a vertical cross-section view of the exemplary intermediate structure showing interposer bonding structures 106 located over the first side surface 102 of the interposer 103 according to various embodiments of the present disclosure. Referring to FIG. 2, the interposer bonding structures 106 may include a plurality of metallic bumps. The interposer bonding structures 106 may be formed by depositing one or more layers of a metal material and patterning the one or more layers of metal material to form the plurality of interposer bonding structures 106 over the first side surface 102 of the interposer 103. Each bonding structure 106 may be electrically coupled to an underlying conductive interconnect structure 108 of the interposer 103. In some embodiments, the interposer bonding structures 106 may form at least one periodic two-dimensional array (such as a rectangular array) of interposer bonding structures 106 within the unit area (UA). In some embodiments, a plurality of interposer bonding structures 106 may be formed over the first side surface 102 of the interposer 103 in each unit area (UA) of the first carrier substrate 101.

In various embodiments, the interposer bonding structures 106 may be configured for subsequent microbump bonding (i.e., C2 bonding) to corresponding bonding structures formed on semiconductor integrated circuit (IC) dies. In some embodiments, the interposer bonding structures 106 may include a plurality of metal pillars. The metal pillars may include copper or a copper-containing alloy. In some embodiments, the bonding structures may include a plurality of metal stacks, such as a plurality of Cu—Ni—Cu stacks. In some embodiments, the interposer bonding structures 106 may include a solder material, such as tin or a tin-containing alloy, on an upper surface of the interposer bonding structures 106. Other suitable materials and/or configurations for the interposer bonding structures 106 are within the contemplated scope of disclosure.

FIG. 3 is a vertical cross-section view of the exemplary intermediate structure showing a plurality of semiconductor integrated circuit (IC) dies 105 mounted over the first side surface 102 of the interposer 103 according to various embodiments of the present disclosure. In some embodiments, the plurality of IC semiconductor dies 105 may include at least one system-on-chip (SoC) die. An SoC die may include, for example, an application processor die, a central processing unit die, and/or a graphic processing unit die. In some embodiments, the plurality of IC semiconductor dies 105 may include at least one memory die. The at least one memory die may include a high bandwidth memory (HBM) die. In some embodiments, a HBM die may include a vertical stack of interconnected memory dies. In some embodiments, the plurality of semiconductor IC dies 105 may be homogeneous, meaning that all of the semiconductor IC dies 105 may be of the same type (e.g., all SoC dies, all HBM dies, etc.). Alternatively, the plurality of semiconductor IC dies 105 may be heterogeneous, meaning that the plurality of semiconductor IC dies 105 may include different types of semiconductor IC dies 105 (e.g., at least one SoC die and at least one HBM die). In some embodiments, the plurality of semiconductor IC dies 105 may include one or more SoC dies and a plurality of HBM dies. The one or more SoC dies may be located in a central portion of the unit area (UA) and the plurality of HBM dies may laterally surround the one or more SoC dies. Further, although two semiconductor IC dies 105 are shown mounted over the first side surface 102 of the interposer 103 in the exemplary embodiment of FIG. 3, it will be understood that in various embodiments more than two semiconductor IC dies 105 may be mounted over the first side surface 102 of the interposer 103.

Referring again to FIG. 3, each of the semiconductor IC dies 105 may include a plurality of semiconductor die bonding structures 119 located over a lower surface of the semiconductor IC die 105. The semiconductor die bonding structures 119 on the semiconductor IC dies 105 may have a similar or identical configuration as the interposer bonding structures 106 over the first side surface 102 of the interposer 103 described above with reference to FIG. 2. For example, the semiconductor die bonding structures 119 on the lower surfaces of the semiconductor IC dies 105 may include a plurality of metallic bumps, such as metal pillars and/or metal stacks. In some embodiments, the semiconductor die bonding structures 119 on the semiconductor IC dies 105 may include a solder material, such as tin or a tin-containing alloy, on the lower surface of the semiconductor die bonding structures 119. The semiconductor die bonding structures 119 on the lower surfaces of each semiconductor IC die 105 may be configured for microbump bonding (i.e., C2 bonding) to corresponding interposer bonding structures 106 on the first side surface 102 of the interposer 103.

The semiconductor IC dies 105 may be mounted over the first side surface 102 of the interposer 103 by placing each of the semiconductor IC dies 105 over the first side surface 102 of the interposer 103 (e.g., using a pick-and-place apparatus). The semiconductor IC dies 105 may be aligned over the first side surface 102 of the interposer 103 such that the semiconductor die bonding structures 119 on the lower surfaces of the semiconductor IC dies 105 contact corresponding interposer bonding structures 106 over the first side surface 102 of the interposer 103. A reflow process may be used to bond the semiconductor die bonding structures 119 on the lower surfaces of the semiconductor IC dies 105 to the corresponding interposer bonding structures 106 over the first side surface 102 of the interposer 103, thereby providing a mechanical and electrical connection between each of the semiconductor IC dies 105 and the interposer 103. In various embodiments, a plurality of semiconductor IC dies 105 may mounted over the first side surface 102 of the interposer 103 within each unit area (UA) of the first carrier substrate 101.

FIG. 4 is a vertical cross-section view of the exemplary intermediate structure showing a first underfill material portion 107 located between the lower surfaces of the semiconductor IC dies 105 and the first side surface 102 of the interposer 103, and a molding portion 109 around the outer periphery of the plurality of semiconductor IC dies 105 according to various embodiments of the present disclosure. Referring to FIG. 4, the first underfill material portion 107 may be applied into the spaces between the first side surface 102 of the interposer 103 and the plurality of semiconductor IC dies 105 mounted to the interposer 103. The first underfill material portion 107 may laterally surround and contact each of the interposer bonding structures 106 and semiconductor die bonding structures 119 that bond the respective semiconductor IC dies 105 to the interposer 103. The first underfill material portion 107 may also be located between adjacent semiconductor IC dies 105 of the plurality of semiconductor IC dies 105 mounted to the interposer 103.

The first underfill material portion 107 may include any underfill material known in the art. For example, the first underfill material portion 107 may be composed of an epoxy-based material, which may include a composite of resin and filler materials. Other suitable materials for the first underfill material portion 107 are within the contemplated scope of disclosure. Any known underfill material application method may be used to apply the first underfill material portion 107.

Referring again to FIG. 4, a molding portion 109 may laterally surround the plurality of semiconductor IC dies 105 mounted to the interposer 103. The molding portion 109 may contact lateral side surfaces of at least some of the semiconductor IC dies 105 and may also contact the first underfill material portion 107. In various embodiments, the molding portion 109 may include an epoxy material. For example, the molding portion 109 may include an epoxy mold compound (EMC) that may include epoxy resin, a hardener (i.e., a curing agent), silica or other filler material (s), and optionally additional additives. The EMC may be applied around the periphery of the semiconductor IC dies 105 in liquid or solid form, and may be hardened (i.e., cured) to form a molding portion 109 having sufficient stiffness and mechanical strength surrounding the plurality of semiconductor IC dies 105. Portions of the molding portion 109 that extend above a horizontal plane including the top surfaces of the semiconductor IC dies 105 may be removed using a planarization process, such as a chemical mechanical planarization (CMP) process.

In various embodiments, each unit area (UA) of the first carrier substrate 101 may include a first underfill material portion 107 located between the first side surface 102 of the interposer 103 and the undersides of the plurality of semiconductor IC dies 105 mounted to the interposer 103, and a molding portion 109 around the outer periphery of the plurality of semiconductor IC dies 105. In some embodiments, the molding portion 109 may form a continuous matrix extending between the unit areas (UAs) of the first carrier substrate 101 and laterally surrounding and embedding the respective sets of semiconductor IC dies 105 within each of the unit areas (UAs) of the first carrier substrate 101.

FIG. 5 is a vertical cross-section view of the exemplary intermediate structure showing a second release layer 121 located over the upper surfaces of the plurality of semiconductor dies 105, the exposed upper surface of the first underfill material portion 107 and the exposed upper surface of the molding portion 109, and a second carrier substrate 111 over the second release layer 121 according to various embodiments of the present disclosure. Referring to FIG. 5, the second release layer 121 may include an adhesive material that may adhere the second carrier substrate 111 to the upper surfaces of the plurality of semiconductor dies 105, the first underfill material portion 107 and the molding portion 109. As with the first release layer 117 described above, the second release layer 121 may also be configured to lose its adhesive properties when subjected to a treatment using an energy source, such as a thermal, optical (e.g., UV, laser, etc.) and/or sonic (e.g., ultrasonic) energy source. In some embodiments, the first release layer 117 and the second release layer 121 may be composed of the same material(s). Alternatively, the first release layer 117 and the second release layer 121 may be composed of different material(s).

Referring again to FIG. 5, the second carrier substrate 111 may be formed of a suitable substrate material, such as the materials described above with reference to the first carrier substrate 101 shown in FIG. 1. In some embodiments, the second carrier substrate 111 may be composed of the same material(s) as the first carrier substrate 101. Alternatively, the second carrier substrate 111 and the first carrier substrate 101 may be composed of different material(s). In various embodiments, the second carrier substrate 111 may extend over each of the unit areas (UAs) of the first carrier substrate 101 such that each unit area (UA) of the first carrier substrate 101 may correspond to an equivalent unit area (UA) of the second carrier substrate 111.

FIG. 6 is a vertical cross-section view of the exemplary intermediate structure showing the first carrier substrate 101 removed according to various embodiments of the present disclosure. Referring to FIG. 6, the first carrier substrate 101 may be removed using any suitable method known in the art. In embodiments in which the first carrier substrate 101 is adhered to the interposer 103 by a first release layer 117, the first release layer 117 may be subjected to a treatment that causes the first release layer 117 to lose its adhesive properties. This may enable the first carrier substrate 101 to be separated from the exemplary intermediate structure. For example, the first release layer 117 may include a light-to-heat conversion (LTHC) material that may be irradiated by optical radiation in a specified wavelength range, such as ultraviolet radiation, causing the LTHC material to heat up and thereby lose adhesion. The first release layer 117 may optionally be irradiated through the first carrier substrate 101 in embodiments in which the first carrier substrate 101 is composed of an optically-transparent material. Alternatively, the first release layer 117 may include a thermally-decomposing adhesive material. The exemplary intermediate structure be subjected to a thermal anneal process at a debonding temperature sufficient to cause the first release layer 117 to decompose and thereby enable the first carrier substrate 101 to be detached from the exemplary intermediate structure. In embodiments in which a thermal anneal process is used to remove the first carrier substate 101, the debonding temperature used to thermally decompose the first release layer 117 may not be sufficient cause the second release layer 121 to lose its adhesive properties.

Referring again to FIG. 6, the exemplary intermediate structure may be inverted (i.e., flipped over), either prior to or following the removal of the first carrier substrate 101, such that the interposer 103 may be located over and supported by the second carrier substrate 111.

FIG. 7A is a vertical cross-section view of the exemplary intermediate structure showing a plurality of bonding pads 115 and semiconductor devices 112 located over the second side surface 104 of the interposer 103 according to various embodiments of the present disclosure. FIG. 7B is a top view of the exemplary intermediate structure of FIG. 7A. The vertical cross-section view of the exemplary intermediate structure of FIG. 7A is taken along line A-A' in FIG. 7B.

Referring to FIGS. 7A and 7B, the bonding pads 115 may be formed by depositing one or more layers of a metal material and patterning the one or more layers of metal material to form the plurality of bonding pads 115 over the second side surface 104 of the interposer 103. Each bonding pad 115 may be electrically coupled to an underlying conductive interconnect structure 108 of the interposer 103. The bonding pads 115 may have a rectangular or square horizontal cross-sectional shape as shown in FIGS. 7A and 7B. Other suitable horizontal cross-sectional shapes of the bonding pads 115, such as polygonal, circular, elliptical, and/or irregular shapes, are within the contemplated scope of disclosure. The bonding pads 115 may be formed of a suitable metallic material, such as copper, aluminum, nickel, titanium, etc., including combinations and alloys thereof. Other suitable metallic materials for the bonding pads 115 are within the contemplated scope of disclosure. In some embodiments, the plurality of bonding pads 115 may form a periodic two-dimensional array (such as a rectangular array) of bonding pads 115 within the unit area (UA). The array of bonding pads 115 may be non-contiguous over the unit area (UA). In particular, the array of bonding pads 115 may include one or more gaps corresponding to the location(s) of one or more semiconductor devices 112 located over the second side surface 104 of the interposer 103. In various embodiments, the array of bonding pads 115 within the unit area (UA) may extend over a greater areal extent within a horizontal plane parallel to the first horizontal direction hd1 and the second horizontal direction hd2 than the corresponding areal extent of the array(s) of interposer bonding structures 106 used to mount the plurality of semiconductor IC dies 105 to the interposer 103. In such embodiments, the bonding pads 115 may also be referred to as "fan-out" bonding pads 115. In some embodiments, the bonding pads 115 may be configured for subsequent mounting of a unit area (UA) of the exemplary intermediate structure to a package substrate, such via a plurality of C4 (i.e., controlled collapse) solder connections.

Referring again to FIGS. 7A and 7B, at least one semiconductor device 112 may be located over the second side surface 104 of the interposer 103. Each of the semiconductor devices 112 may be mounted to the second side surface 104 of the interposer by a plurality of semiconductor device bonding structures 113. In some embodiments, the semiconductor device bonding structures 113 may have a similar or identical configuration as the interposer bonding structures 106 located over the first side surface 102 of the interposer 103 described above with reference to FIG. 2. For example, the semiconductor device bonding structures 113 may include a plurality of metallic bumps, such as metal pillars and/or metal stacks, formed over the second side surface 104 of the interposer 103. The semiconductor devices 112 may be mounted to respective sets of semiconductor device bonding structures 113 on the second side surface 104 of the interposer 103 via microbump (e.g., C2) bonding connections. Each of the semiconductor device bonding structures 113 may be electrically coupled to an underlying conductive interconnect structure 108 of the interposer 103. Accordingly, each of the semiconductor devices 112 may be electrically coupled to one or more semiconductor IC dies 105 via the interposer 103.

In one non-limiting example, the semiconductor devices 112 may be mounted over the second side surface 104 of the interposer 103 by placing each of the semiconductor devices 112 over the first side surface 102 of the interposer 103 such that the lower surfaces of the respective semiconductor devices 112 contact semiconductor device bonding structures 113 located over the second side surface 104 of the interposer 103. A reflow process may be used to bond the semiconductor devices 112 to respective semiconductor device bonding structures 113 over the second side surface 104 of the interposer 103, thereby providing a mechanical and electrical connection between each of the semiconductor devices 112 and the interposer 103.

The at least one semiconductor device 112 may be composed of a suitable semiconductor material. In some embodiments, the at least one semiconductor device 112 may include silicon. Other suitable semiconductor materials are within the contemplated scope of disclosure. In some embodiments, each of the semiconductor devices 112 may have electronic circuit elements, such as conductive interconnect structures, located on and/or within the semiconductor device 112. Additional electronic circuit elements, such as transistors, capacitors, resistors, diodes, photodiodes, fuse devices, or other similar devices, may also be located on and/or within the semiconductor devices 112 in various embodiments. In some embodiments, the at least one semiconductor device 112 may function as a capacitor and may help to improve signal integrity of the one or more semiconductor IC dies 105 to which the respective semiconductor device 112 is electrically coupled. The at least one semiconductor device 112 mounted on the semiconductor device bonding structures 113 located over the second side surface 104 of the interposer 103 together with the interposer 103 and semiconductor dies 105 (along with other elements as discussed with reference to FIG. 10 below) may form the package structure 150.

In the embodiment shown in FIGS. 7A and 7B, each of the semiconductor devices 112 may have a rectangular horizontal cross-sectional shape. Other suitable horizontal cross-sectional shapes of the semiconductor devices 112, such as polygonal, circular, elliptical, and/or irregular shapes, are within the contemplated scope of disclosure. Each of the semiconductor devices 112 may have a first maximum length dimension, $L_{S1}$, along a first horizontal direction hd1 and a second maximum length dimension, $L_{S2}$, along a second horizontal direction hd2 that is orthogonal to the first horizontal direction hd1. Each of the semiconductor devices 112 may have an identical size and shape, or may have different (i.e., non-uniform) sizes and/or shapes. For example, in the embodiment shown in FIGS. 7A and 7B, the semiconductor devices 112 have non-uniform first and second maximum length dimensions, $L_{S1}$ and $L_{S2}$. In some embodiments, the first and second maximum length dimensions, $L_{S1}$ and $L_{S2}$, of the semiconductor devices 112 may be between about 300 µm and about 5 mm, although greater and lesser maximum length dimensions, $L_{S1}$ and $L_{S2}$, are within the contemplated scope of disclosure. In various embodiments, a height dimension, H, between the upper surfaces of the semiconductor devices 112 and the second side surface 104 of the interposer 103 may be greater than 10 µm, such as between 50 µm and 150 µm, including about 100 µm.

In various embodiments, a plurality of bonding pads 115 may be formed over the second side surface 104 of the interposer 103 and at least one semiconductor device 112 may be mounted over the second side surface 104 of the interposer 103 within each unit area (UA) of the second carrier substrate 111.

FIG. 8A is a vertical cross-section view of a package substrate 201 according to various embodiments of the present disclosure. FIG. 8B is a top view of the package substrate 201 of FIG. 8A. Referring to FIGS. 8A and 8B, the package substrate 201 may include any suitable substrate material(s), such as polymer, glass, epoxy resin, ceramic and/or semiconductor substrate materials. The package substrate 201 may include a first side surface 202 (which, for convenience, may also be referred to as a "front" side surface 202 of the package substrate 201) and a second side surface 203 (which, for convenience, may also be referred to as a "rear" side surface 203 of the package substrate) that is opposite the first side surface 202.

The package substrate 201 may be configured such that a plurality of semiconductor IC dies 105 may be mounted over the front side surface 202 of the package substrate 201 to provide a semiconductor package. In various embodiments, the plurality of semiconductor IC dies 105 may be mounted to an interposer 103, such as an interposer 103 as described above with reference to FIGS. 1-7B, and the interposer 103 having the plurality of semiconductor IC dies 105 mounted thereon may be mounted over the front side surface 202 of the package substrate 201 to provide the semiconductor package. The interposer 103 may be mounted over a bonding region 206 of the package substrate 201.

In various embodiments, the package substrate 201 may include redistribution structures 204 (e.g., metal lines, vias, bonding regions, etc.) extending within the package substrate 201. In some embodiments, the rear side surface 203 of the package substrate 201 may be configured to be mounted to a supporting substrate, such as a printed circuit board (PCB). Electrical connections between the supporting substrate (e.g., a PCB) and the semiconductor package may be made via the redistribution structures 204 within the package substrate 201.

In some embodiments, the package substrate 201 may include a multi-layer structure including a substrate core 213, at least one redistribution layer 214, and at least one outer coating layer 215. For example, the package substrate 201 may include a pair of redistribution layers 214 located above and below the substrate core 213, and a pair of outer coating layers 215 located above and below the respective redistribution layers 214. The outer coating layers 215 may form the front side surface 202 and rear side surface 203 of the package substrate 201. The substrate core 213 may be a plate-like member composed of a suitable material such as an epoxy resin, glass, and/or ceramic material. The substrate core 213 may include a plurality of conductive via structures 216 extending through the substrate core 213. The redistribution layers 214 may include conductive interconnect structures 217, such as metal lines, vias and bonding regions, embedded in a dielectric material matrix 218. In some embodiments, the dielectric material matrix 218 may include multiple layers of a dielectric material, such as a photosensitive epoxy material. Each layer of dielectric material may be lithographically patterned to form open regions (e.g., trenches and via openings) within the respective layers of dielectric material. A metallization process may be used to fill the open regions with a suitable conductive material, such as copper or a copper-alloy, within each layer of dielectric material to form the conductive interconnect structures 217 embedded within the dielectric material matrix 218. The outer coating layers 215 of the package substrate 201 may include a layer of solder resist material formed over the respective redistribution layers 214. Each of the layers of solder resist material may provide a protective coating for the package substrate 201 and the underlying redistribution structures 204 within the package substrate 101. The solder resist material may also inhibit solder material from adhering to the front side surface 202 and rear side surface 203 of the package substrate 201 during a subsequent solder reflow process. An outer coating layer 215 formed of solder resist material may also be referred to as a "solder mask." Other suitable configurations for the package substrate 201 are within the contemplated scope of disclosure.

In various embodiments, the package substrate 201 may have a total thickness, T, between the front side surface 202 and the rear side surface 203 of the package substrate 201 that is between about 600 μm and about 1,500 μm, although greater and lesser thicknesses for the package substrate 201 are within the contemplated scope of disclosure.

FIG. 9A is a vertical cross-section view of the package substrate 201 showing a plurality of recesses 205 formed in the first side surface 202 of the package substrate 201 according to various embodiments of the present disclosure. FIG. 9B is a top view of the package substrate of FIG. 9A. The vertical cross-section view of the package substrate 201 of FIG. 9A is taken along line B-B' in FIG. 9B.

Referring to FIGS. 9A and 9B, at least one recess 205 may be formed in the first side surface 202 of the package substrate 201. Each recess 205 may correspond to the location of a semiconductor device 112 over the second side surface 104 of an interposer 103 to be subsequently mounted over the first side surface 202 of the package substrate 201. In various embodiments, each recess 205 may have a vertical depth, D, from the first side surface 202 of the package substrate 201 of at least 5 μm, which may be sufficient to accommodate the thickness of the semiconductor device 112 as well as the height of the semiconductor bonding structures 113 that bond the semiconductor device 112 to the second side surface 104 of the interposer 103 when the interposer 103 is mounted over the first side surface of the package substrate 201 as described in further detail below. In some embodiments, the depth, D, of each recess 205 may be greater than or equal to 10 μm and less than or equal to 100 μm, although greater and lesser depth dimensions, D, of the recesses 205 are within the contemplated scope of disclosure. In some embodiments, a ratio of the depth dimension D of each recess 205 to the total thickness T of the package substrate 201 may be between about and 0.16, such as between 0.015 and 0.1. This may provide sufficient clearance to enable an adequate flow of underfill material between the semiconductor device 112 and the bottom surface of the recess 205 without compromising the performance or mechanical integrity of the package substrate 201.

In various embodiments, the total area of each recess 205 within a horizontal plane parallel to the first horizontal direction hd1 and the second horizontal direction hd2 may be greater than the total area of the corresponding semiconductor device 112 within a horizontal plane parallel to the first horizontal direction hd1 and the second horizontal direction hd2. In some embodiments, the total area of the recess 205 may be greater than the total area of the corresponding semiconductor device 112 by at least about 2%. In various embodiments, the maximum length dimensions, $L_{R1}$ and $L_{R2}$, of each recess along the first horizontal direction hd1 and the second horizontal direction hd2, respectively, may be greater than the maximum length dimensions, $L_{S1}$ and $L_{S2}$, of the corresponding semiconductor device 112 along the first horizontal direction hd1 and the second horizontal direction hd2, respectively. In some embodiments, the maximum length dimensions, $L_{R1}$ and $L_{R2}$, of the recess 205 may be greater than the than the maximum length dimensions, $L_{S1}$ and $L_{S2}$, of the corresponding semiconductor device 112 by at least about 50 μm. This may enable sufficient underfill material to flow around the sides of the semiconductor devices 112. In some embodiments, at least one length dimension of the recess 205 may be 350 μm or more.

Figure 9C:
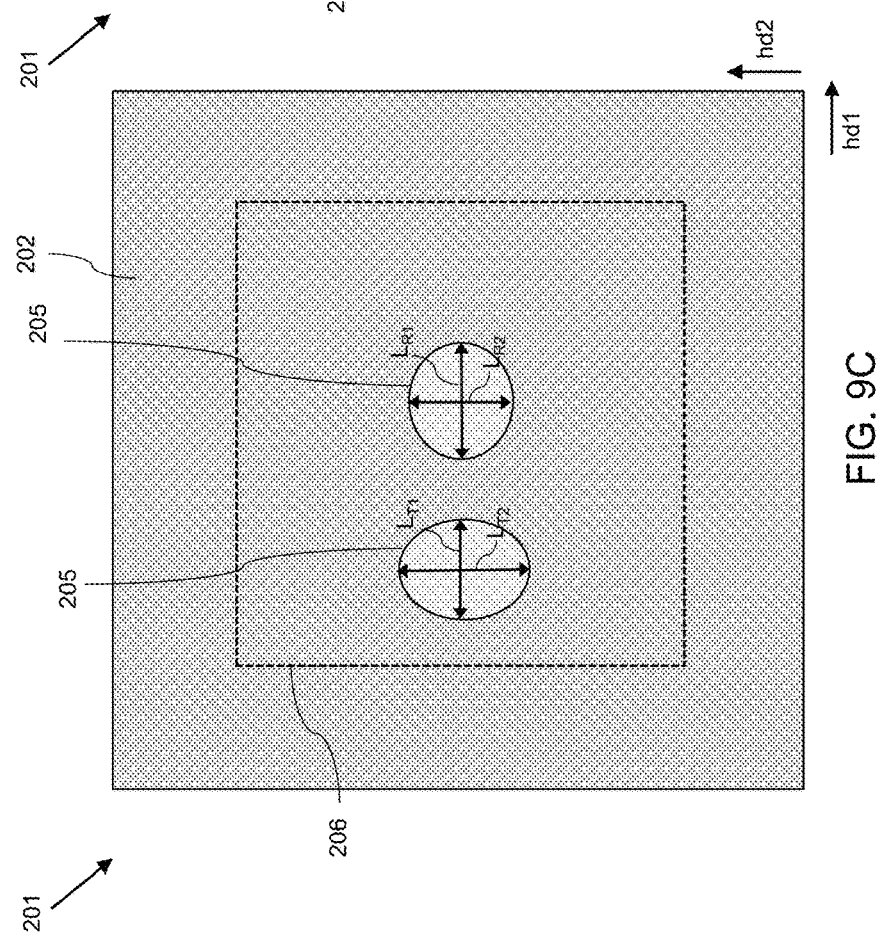
FIG. 9C is a top view of an alternative embodiment package substrate of FIG. 9A.

Each of the recesses 205 may have a suitable horizontal cross-sectional shape, such as a polygonal, circular, elliptical, and/or irregular shape. FIGS. 9A and 9B illustrate a pair of recesses 205 having a rectangular horizontal cross-sectional shape. FIG. 9C is a top view of a package substrate 201 having recesses 205 with an elliptical horizontal cross-section shape according to another embodiment of the present disclosure. FIG. 9D is a top view of a package substrate 201 having recesses 205 with an irregular horizontal cross-section shape according to yet another embodiment of the present disclosure. Other suitable shapes for the recesses 205 are within the contemplated scope of disclosure. In some embodiments, the horizontal cross-sectional shape of each recess 205 may be the same as the horizontal cross-sectional shape of the corresponding semiconductor device 112. Alternatively, a recess 205 may have a different horizontal cross-sectional shape than the shape of the corresponding semiconductor device 112, so long as the recess 205 is large enough to encompass the corresponding semiconductor device 112. In the embodiment shown in FIGS. 9A and 9B, the recesses 205 are shown having vertically-extending sidewalls and sharp, squared corners, although it will be understood that various embodiments may include recesses 205 having tapered or curved sidewalls and/or angled or rounded corners.

The one or more recesses 205 may be formed in the front side surface 202 of the package substrate 201 using any suitable technique. In some embodiments, the one or more recesses 205 may be formed using a lithographic process. For example, a layer of photoresist may be applied over the front side surface 202 of the package substrate 201 and exposed to radiation through an optical mask to transfer the pattern of the one or more recesses 205 to the photoresist layer. The photoresist layer may then be developed to form a patterned mask having openings through the patterned mask corresponding to the locations of the one or more recesses 205 to be subsequently formed. One or more etching processes may be performed through the patterned mask to selectively remove material from the package substrate 201 to a desired depth, D, thereby forming the one or more recesses 205 on the front side surface 202 of the package substrate 201. The patterned mask may then be removed using a suitable process, such as via ashing or dissolution using a solvent.

In other embodiments, the one or more recesses 205 may be formed using a machining technique, such as using computer numerical control (CNC) machining of the front side surface 202 of the package substrate 201. Other known machining techniques, such as drilling or physical etching techniques, may be utilized. In some embodiments, the one or more recesses 205 may be formed using an ablation technique, such as via laser ablation of select portions of the front side surface 202 of the package substrate 201.

Figure 10A:
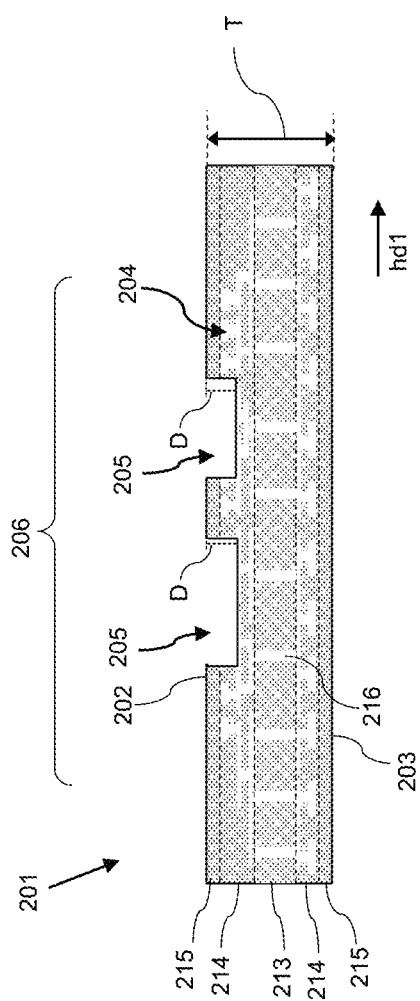
FIG. 10A is a vertical cross-section view of a package substrate including a plurality of recesses formed in the first side surface of the package substrate extending partially into a redistribution layer of the package substrate according to an embodiment of the present disclosure.

In some embodiments, the one or more recesses 205 may be formed in the front side surface 202 of the package substrate 201 during the process of manufacturing the package substrate 201. Alternatively, the one or more recesses 205 may be formed after the package substrate 201 is manufactured using post-processing techniques. In embodiments in which the package substrate 201 includes a multilayer structure including a redistribution layer 214 and an outer coating layer 215 (e.g., a solder mask) surrounding a substrate core 213, the one or more recesses 205 may be formed through the outer coating layer 215 and may optionally extend partially or completely through the redistribution layer 214. FIG. 10A is a vertical cross-section view of the package substrate 201 showing a plurality of recesses 205 formed in the first side surface 202 of the package substrate 201 extending partially into the redistribution layer 214 of the package substrate 201 according to an embodiment of the present disclosure. The recesses 205 may be formed by depositing a whole layer of the outer coating layer 215 and then etch the outer coating layer 215.

Figure 10B:
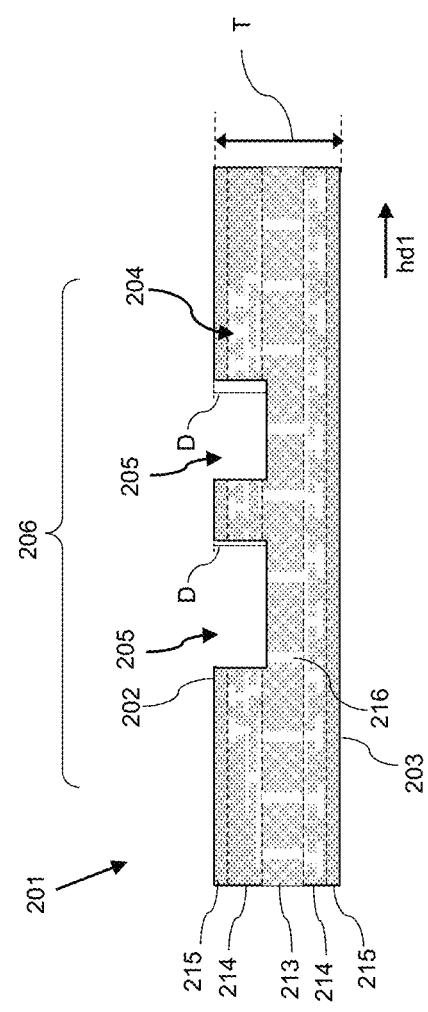
FIG. 10B is a vertical cross-section view of a package substrate including a plurality of recesses formed in the first side surface of the package substrate extending partially into a substrate core of the package substrate according to an embodiment of the present disclosure.

In some embodiments, the depth, D, of a recess 205 may extend to and/or into the substrate core 213 of the package substrate 201. FIG. 10B is a vertical cross-section view of the package substrate 201 showing a plurality of recesses 205 formed in the first side surface 202 of the package substrate 201 extending partially into the substrate core 213 of the package substrate 201 according to an embodiment of the present disclosure.

In some embodiments, one or more recesses 205 may be formed by depositing an outer coating layer 215 over a surface of a package substrate 201, and performing an etching process to remove select portions of the outer coating layer 215 to form one or more recesses 205 in the first side surface 202 of the package substrate 201. The outer coating layer 215 may be a solder resist (i.e., solder mask) material as described above. Other suitable materials for the outer coating layer 215 are within the contemplated scope of disclosure. In various embodiments, the etching process may be performed through a lithographically-pattered mask that may expose the outer coating layer 215 in portions corresponding to the one or more recesses 205 and may protect the remaining portions of the outer coating layer 215 from being etched.

In embodiments in which underlying redistribution structures 204 of the package substrate 201 are exposed on the bottom and/or side surfaces of a recess 205, such as shown in FIGS. 10A and 10B, the redistribution structures may optionally electrically connect to a semiconductor device 112 over the second side surface 104 of an interposer 103 to be subsequently mounted over the first side surface 202 of the package substrate 201.

FIG. 11A is a vertical cross-section view of the package substrate 201 showing a channel 260 formed in each recess 205 in the first side surface 202 of the package substrate 201 according to various embodiments of the present disclosure. FIG. 11B is a top view of the package substrate of FIG. 11A. The vertical cross-section view of the package substrate 201 of FIG. 11A is taken along line B-B' in FIG. 11B. Referring to FIGS. 11A and 11B, a channel 260 may be formed within the bottom surface of each of the recesses 205 in the first side surface 202 of the package substrate 201. Each channel 260 may have an elongated shape including a width dimension, $W_C$, and a length dimension, $L_C$ that is greater than the width dimension, $W_C$. The width dimension $W_C$ of each channel 260 may be less than the corresponding width of the recess 205 in which the channel 260 is located. The length dimension, $L_C$, of each channel may be less than, equal to or greater than the corresponding length of the recess 205 in which the channel is located. In the embodiment shown in FIG. 11B, for example, the length dimension $L_C$ of the channel 260 on the left-hand side of FIG. 11B is less than the corresponding length dimension (i.e., $L_{R2}$) of the recess 205 in which the channel 260 is located, whereas the length dimension $L_C$ of the channel 260 on the right-hand side of FIG. 11B is greater than the corresponding length dimension (i.e., $L_{R2}$) of the recess 205 in which the channel 260 is located. In some embodiments, the widths $W_C$ of each channel 260 may be between about 5 μm and about 500 μm, although greater and lesser width dimensions are within the contemplated scope of disclosure. Each channel 260 may have a uniform width $W_C$ along its length, or may have a width dimension that varies along the length of the channel 260. In some embodiments, the lengths $L_C$ of each channel 260 may be between about 10 μm and about 5 mm, although greater and lesser length dimensions are within the contemplated scope of disclosure. Each channel 260 may follow a straight-line path along its length $L_C$ as shown in FIG. 11B. Alternatively, one or more channels 260 may follow a curved or angled (e.g., zig-zag) path along its length $L_C$.

Referring to FIG. 11A, each of the channels 260 may have a depth dimension, Dc, with respect to the bottom surface of the recess 205 within which the channel 260 is located. In various embodiments, a maximum depth dimension Dc of each channel may be between about 3 μm and about 30 μm, although greater and lesser maximum depth dimensions are within the contemplated scope of disclosure.

The channels 260 may be formed using any of the techniques described above for forming the at least one recess 205. For example, the channels 260 may be formed via an etching process through a lithographically-patterned mask, via a machining technique, such as CNC machining, milling, drilling, physical etching, etc., or using an ablation technique, such as laser ablation. In some embodiments, the channels 260 may be formed in a separate step following the formation of the one or more recesses 205. Alternatively, the channels 260 may be formed simultaneous with the formation of the one or more recesses 205. In other embodiments, the channels 260 may be formed in an initial step, and the one or more recesses 205 may be formed around the channels 260 in subsequent processing steps.

FIGS. 11C-11H are a tops views of a package substrate 201 illustrating various configurations of recesses 205 and channels 260 as described above with reference to FIGS. 11A and 11B. FIG. 11C is a top view of a package substrate 201 having recesses 205 with an elliptical cross-section shape and a channel 260 located within each recess 205 according to an embodiment of the present disclosure. In the recess 205 on the left-hand side, the channel 260 extends along the second horizontal direction hd2, and in the recess on the right-hand side, the channel 260 extends along the first horizontal direction hd1.

FIG. 11D is a top view of a package substrate 201 having recesses 205 with an irregular horizontal cross-section shape and a channel 260 located within each recess 205 according to yet another embodiment of the present disclosure. In this embodiment, each of the channels 260 extends at an oblique angle with respect to the first horizontal direction hd1 and the second horizontal direction hd2.

FIG. 11E is a top view of a package substrate 201 having recesses 205 with multiple channels 260 located within each recess 205 according to yet another embodiment of the present disclosure. Although the embodiment shown in FIG. 11E includes three channels 260 located within each recess 205, it will be understood that the recesses 205 may include a greater or lesser number of channels 260. Further, each of the channels 260 located within a recess 205 may have a uniform size, shape and orientation, or may have non-uniform sizes, shaped and/or orientations.

FIG. 11F is a top view of a package substrate 201 having recesses 205 with multiple irregularly-shaped channels 260 located within each recess 205 according to yet another embodiment of the present disclosure.

FIG. 11G is a is a top view of a package substrate 201 having recesses 205 with at least one channel 260 extending outside of the boundaries of each recess 205 according to yet another embodiment of the present disclosure. FIG. 11H is a top view of a package substrate having recesses 205 and at least one channel 260 extending between multiple recesses 205 according to yet another embodiment of the present disclosure.

In various embodiments, the channels 260 formed in the recesses 205 on the first side surface 202 of the package substrate 201 may help to release air and balance the amount of underfill material within the recesses 205 when an interposer 103 including one or more semiconductor devices 112 over the second side surface 104 of an interposer 103 is subsequently mounted over the first side surface 202 of the package substrate 201.

Figure 12:
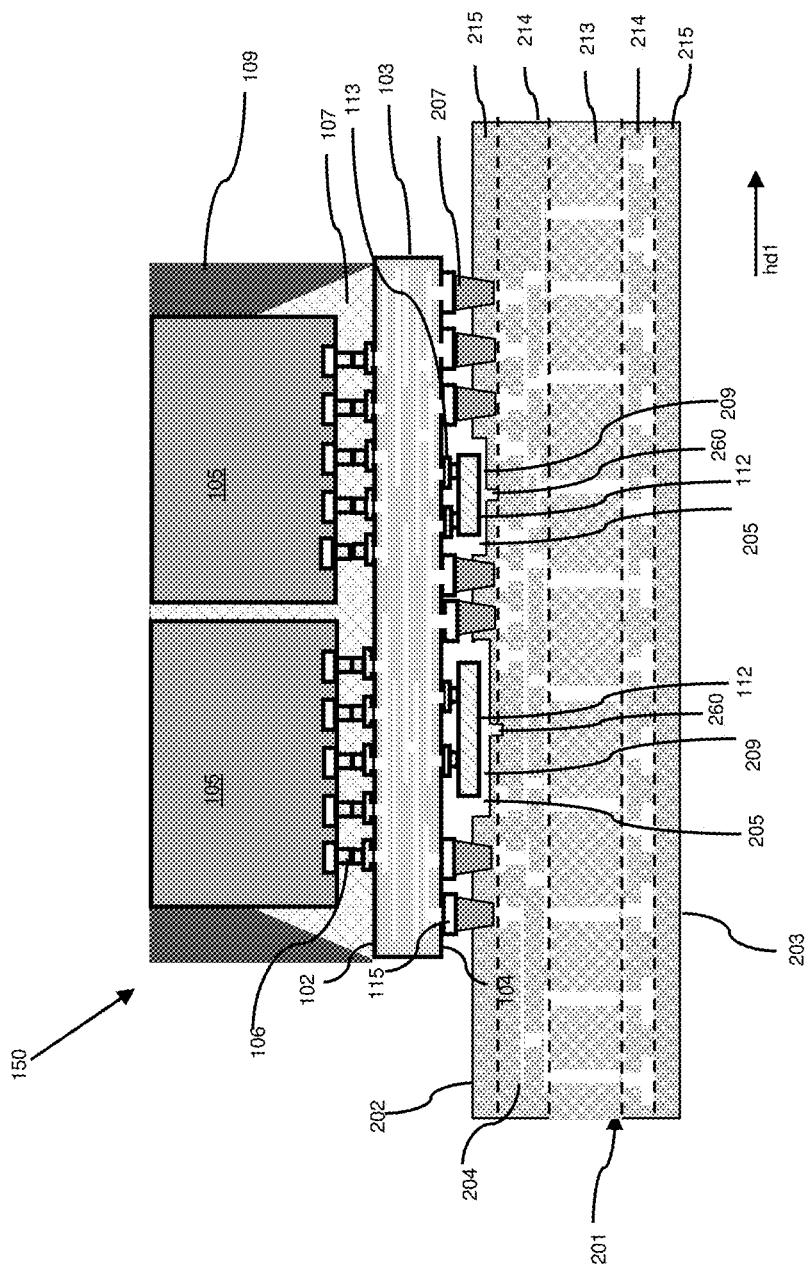
FIG. 12 is a vertical cross-section view of an exemplary intermediate structure during a process of forming a semiconductor package showing a package structure mounted over the front side surface of a package substrate according to various embodiments of the present disclosure.

FIG. 12 is a vertical cross-section view of an exemplary intermediate structure during a process of forming a semiconductor package showing a package structure 150 mounted over the front side surface 202 of a package substrate 201 according to various embodiments of the present disclosure. Referring to FIG. 12, the second carrier substrate 111 may be removed from the exemplary intermediate package structure 150 shown in FIGS. 7A and 7B. The second carrier substrate 111 may be removed using any suitable method known in the art, such as any of the methods described above for removal of the first carrier substrate 101. In embodiments in which the second carrier substrate 111 is adhered to the semiconductor IC dies 105, the first underfill material portion 107 and the molding portion 109 using a second release layer 121, the second release layer 121 may be subjected to a treatment that causes the second release layer 121 to lose its adhesive properties, such as a thermal anneal and/or an optical irradiation treatment process as described above with reference to FIG. 6.

A dicing process may be used to separate each unit area (UA) of the exemplary intermediate structure to provide a plurality of discrete package structures 150. Each package structure 150 may include an interposer 103, a plurality of semiconductor IC dies 105 mounted over a first side surface 102 of the interposer 103, a first underfill material portion 107 located in the gaps between the first side surface 102 of the interposer 103 and each of the semiconductor IC dies 105, and a molding portion 109 laterally surrounding the plurality of semiconductor IC dies 105. The interposer 103 may include a plurality of bonding pads 115 and at least one semiconductor device 112 located over a second side surface 104 of the interposer 103.

Referring again to FIG. 12, an etching process may be used to selectively remove portions of the outer coating layer 215 (e.g., solder mask) from the front side surface 202 of the package substrate 201 and expose underlying redistribution structures 204 (e.g., bonding pads). In some embodiments, the same etching process that is used to expose the redistribution structures 204 through the front side surface 202 of the package substrate 201 may also be used to form the at least one recess 205 and/or channel 260 in the package substrate 201 as described above with reference to FIGS. 9A-11H. Alternatively, the at least one recess 205 and/or channel 260 may be formed in a separate process than the etching process(es) used to expose the redistribution structures 204. For example, a machining process as discussed above may be used to form the at least one recess 205 and/or channel 260 within the at least one recess 205. The pattern of the redistribution structures 204 exposed through the front side surface 202 of the package substrate 201 may correspond to the pattern of bonding pads 115 located over the second side surface 104 of the interposer 103.

Referring again to FIG. 12, the package structure 150 may be inverted relative to the orientation shown in FIGS. 7A and 7B and aligned over the package substrate 201 such that the second side surface 104 of the interposer 103 faces the front side surface 202 of the package substrate 201. The package structure 150 may be disposed over the front side surface 202 of the package substrate 201 such that an array of solder material portions 207 are located between the redistribution structures 204 exposed through the front side surface 202 of the package substrate 201 and the bonding pads 115 over the second side surface 104 of the interposer 103. Each of the semiconductor devices 112 mounted over the second side surface 104 of the interposer 103 may be located over a corresponding recess 205 in the front side surface 202 of the package substrate 201. Each of the recesses 205 in the front side surface 202 may include at least one channel 260 in a bottom surface of the recess 205.

A reflow process may be performed to reflow the solder material portions 207, thereby inducing bonding between the interposer 103 of the package structure 150 and the package substrate 201. Each of the solder material portions 207 may be bonded to a respective one of the bonding pads 115 over the second side surface 104 of the interposer 103 and to a respective one of redistribution structures 204 (e.g., bonding pads) of the package substrate 201. In some embodiments, the solder material portions 207 may include C4 solder balls, and the package structure 150 may be bonded to the substrate package 201 through an array of C4 solder balls.

Referring again to FIG. 12, following the bonding of the package structure 150 to the package substrate 201, each of the semiconductor devices 112 may be located over a corresponding recess 205 in the front side surface 202 of the semiconductor package 201. In various embodiments, each of the semiconductor devices 112 may be spaced away from and may not be in contact with the semiconductor package 201. As shown in FIG. 12, a gap 209 may be present between the bottom surface of each recess 205 in the package substrate 201 and the lower surface of the overlying semiconductor device 112. In various embodiments, a height of the gap 209 between the bottom surface of the recess 205 and the lower surface of the overlying semiconductor device 112 may be at least 5 µm. In addition, the peripheral edges of the semiconductor devices 112 may be offset from the sidewalls of the adjacent recess 205 in the package substrate 201 such that no portion of the overlying semiconductor device 112 may extend to or beyond a vertical boundary defined by the peripheral sidewalls of the recess 205. Each of the semiconductor devices 112 may overlie at least one channel 260 formed in a bottom surface of a recess 205.

Figure 13:
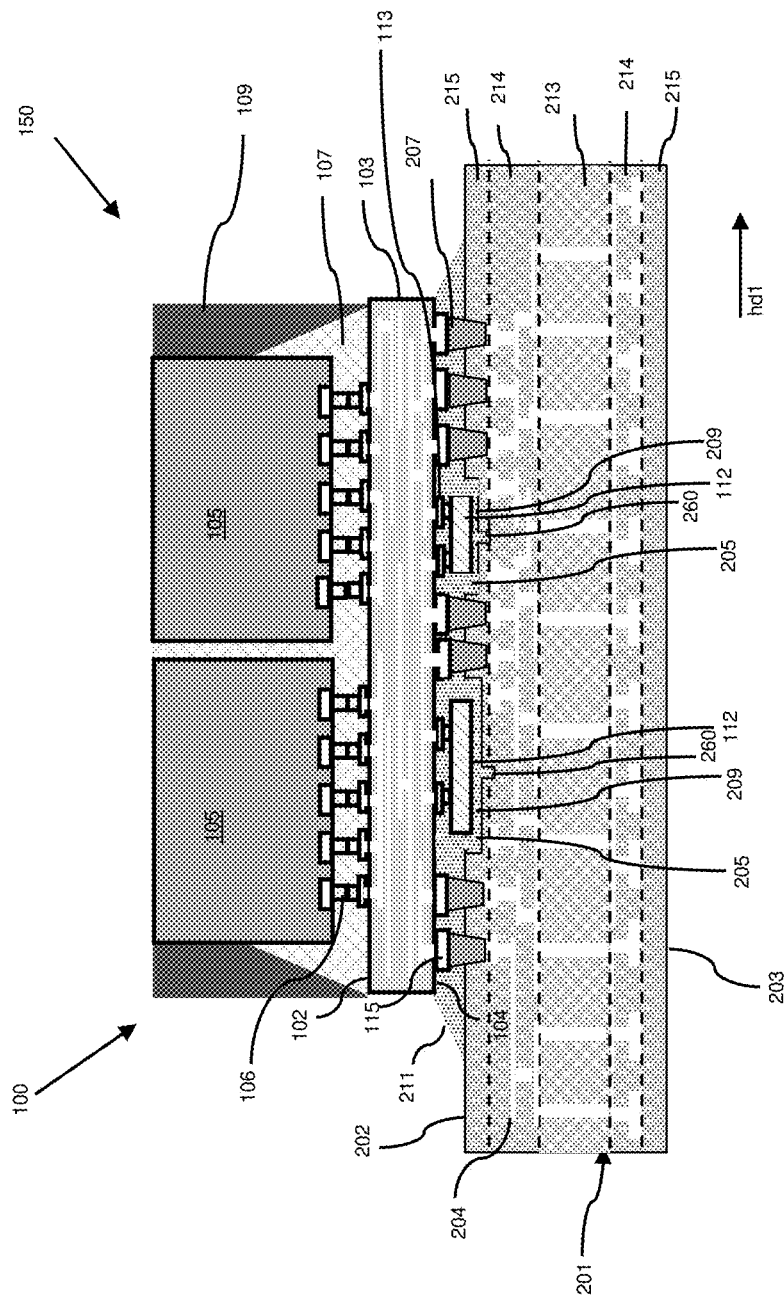
FIG. 13 is a vertical cross-section view of a semiconductor package including a second underfill material portion located between the front side surface of the package substrate and the second side surface of the interposer according to various embodiments of the present disclosure.

FIG. 13 is a vertical cross-section view of a semiconductor package 100 including a second underfill material portion 211 located between the front side surface 202 of the package substrate 201 and the second side surface 104 of the interposer 103 according to various embodiments of the present disclosure. Referring to FIG. 13, the second underfill material portion 211 may be applied into the space between the front side surface 202 of the package substrate 201 and the second side surface 104 of the interposer 103. The second underfill material portion 211 may laterally surround and contact each of the solder material portions 207 that bond the interposer 103 to the package substrate 201 and may also laterally surround and contact each of the semiconductor device bonding structures 113 that bond the respective semiconductor devices 112 to the second side surface 104 of the interposer 103. The second underfill material portion 211 may flow into each of the recesses 205 in the front side surface 202 of the package substrate 201 and may also flow into the gaps 209 between the bottom surface of each recess 205 in the package substrate 201 and the lower surface of the overlying semiconductor device 112. The second underfill material portion 211 may also flow into channels 260 in the bottom surface of each recess 205. Accordingly, each semiconductor device 112 may be surrounded by and contact the second underfill material portion 211 over the upper, lower and lateral side surfaces of the respective semiconductor device 112. In various embodiments, the portions of the second underfill material portion 211 located within the gaps 209 between the bottom surface of each recess 205 in the package substrate 201 and the lower surface of the overlying semiconductor device 112 may have a thickness of at least 5 μm.

In various embodiments, by providing recesses 205 in the front side surface 202 of the package substrate 201 corresponding to the locations of semiconductor devices 112, a minimum gap distance may be maintained between the semiconductor devices 112 and the package substrate 201. This may ensure that a sufficient amount of the second underfill material portion 211 may flow between each semiconductor device 112 and the front side surface 202 of the package substrate 201. The one or more channels 260 in the bottom surfaces of each of the recesses 205 may help to release air and balance the amount of the second underfill material portion 211 within the recesses 205. This may improve the integrity of the structural coupling between the interposer 103 and the package substrate 201 in the semiconductor package 100, and may significantly reduce the likelihood of package defects, such as delamination, cracking, and/or popcorn defects, thereby improving package yields and performance.

The second underfill material portion 211 may include any underfill material known in the art. For example, the second underfill material portion 211 may be composed of an epoxy-based material, which may include a composite of resin and filler materials. Other suitable materials for the second underfill material portion 211 are within the contemplated scope of disclosure. Any known underfill material application method may be used to apply the second underfill material portion 211.

In some embodiments, electrical connections to the semiconductor package 100 may be made by mounting the rear side surface 203 of the semiconductor package 200 onto a support substrate containing electrical interconnects, such as a printed circuit board (PCB).

Figure 14:
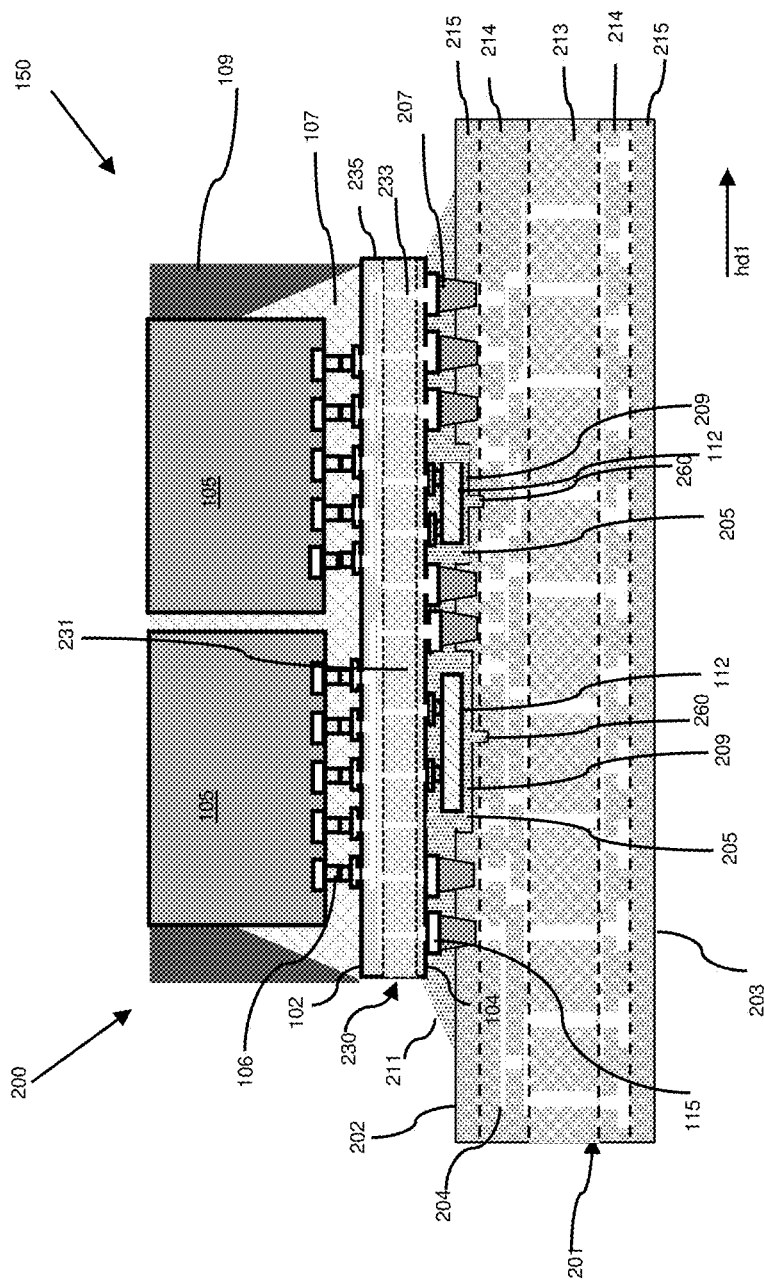
FIG. 14 is a vertical cross-section view of a semiconductor package including a semiconductor material interposer according to an alternative embodiment of the present disclosure.

FIG. 14 is a vertical cross-section view of a semiconductor package 200 including a semiconductor material interposer 230 according to an alternative embodiment of the present disclosure. Referring to FIG. 14, the semiconductor package 200 according to the alternative embodiment may be similar to the semiconductor package 100 shown in FIG. 13, and may include a package structure 150 having interposer 230, a plurality of semiconductor IC dies 105 mounted over a first side surface 102 of the interposer 230, a first underfill material portion 107 located in the gaps between the first side surface 102 of the interposer 230 and each of the semiconductor IC dies 105, and a molding portion 109 laterally surrounding the plurality of semiconductor IC dies 105. The interposer 230 may include a plurality of bonding pads 115 and at least one semiconductor device 112 located over a second side surface 104 of the interposer 230. The package structure 150 may be bonded to the front side surface 202 of a package substrate 201 via a plurality of solder material portions 207. The front side surface 202 of the package substrate 201 may include at least one recess 205, where each recess 205 in the package substrate 201 corresponds to the location of a semiconductor device 112 mounted to the second side surface 104 of the interposer 230. Each of the recesses 205 in the front side surface 202 may include at least one channel 260 in a bottom surface of the recess 205.

A second underfill material portion 211 may be located in the space between the front side surface 202 of the package substrate 201 and the second side surface 104 of the interposer 103, including within the gap(s) 209 between the bottom surface of each recess 205 and the lower surface of the overlying semiconductor device 112, and within each of the channels 260 in a bottom surface of the respective recesses 205.

The semiconductor package 200 of FIG. 14 may differ from the semiconductor package 100 of FIG. 13 in that the semiconductor package 200 of FIG. 14 includes a semiconductor material interposer 230 as opposed to an organic interposer 103. Referring to FIG. 14, the semiconductor material interposer 230 may include a semiconductor device 231, such as a silicon member, having a plurality of conductive through-vias 233 (e.g., through-silicon vias) extending therethrough. The conductive through-vias 233 may carry electrical signals between the plurality of semiconductor IC dies 105 mounted to the first side surface 102 of the interposer 230 and the package substrate 201. In some embodiments, the semiconductor material interposer 230 may include at least one redistribution layer 235 including interconnect structures embedded in a dielectric material matrix located above and/or below the semiconductor device 231.

Figure 15:
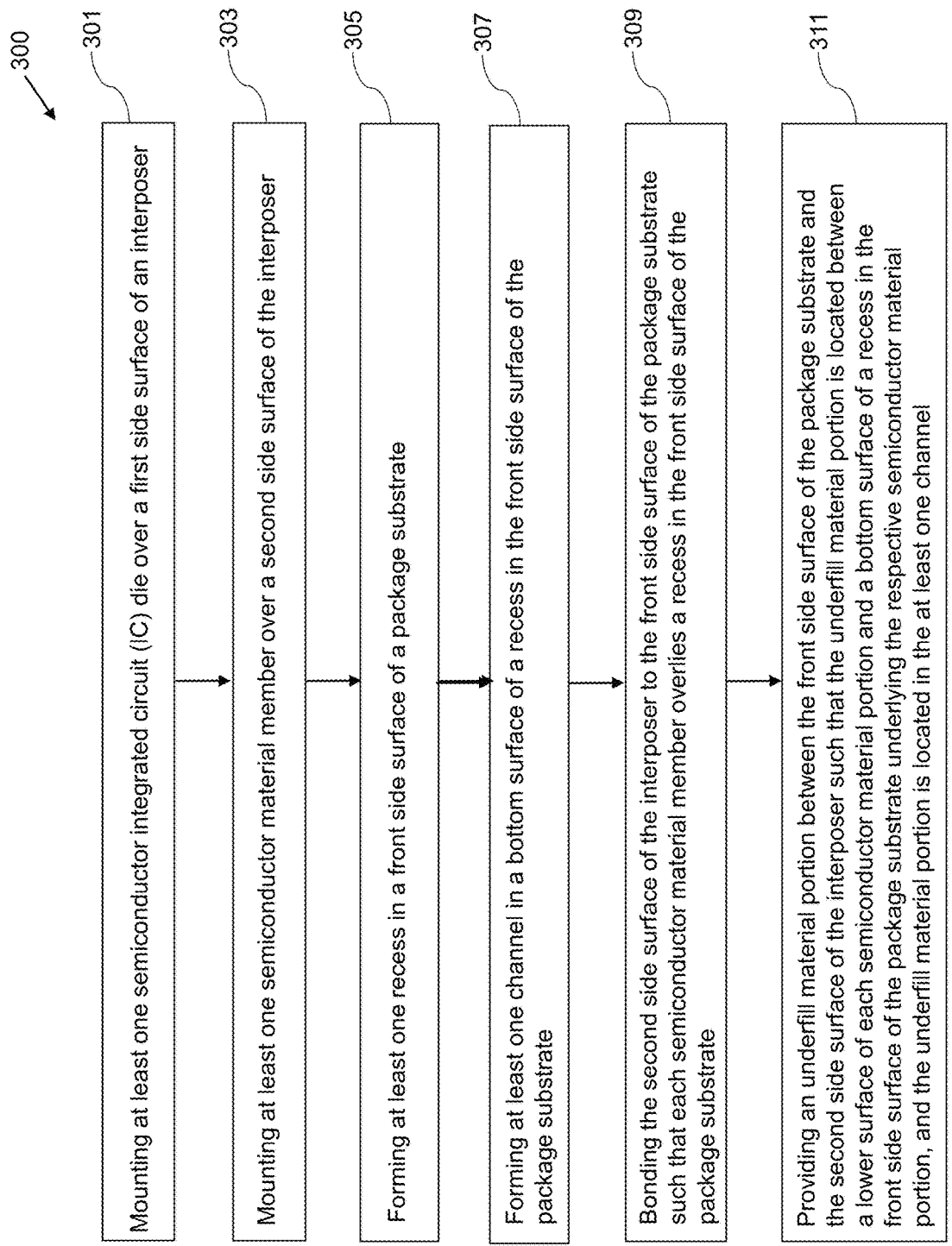
FIG. 15 is a flow diagram illustrating a method of fabricating a semiconductor package according to various embodiments of the present disclosure.

FIG. 15 is a flowchart illustrating a method 300 of fabricating a semiconductor package 100, 200 according to various embodiments of the present disclosure. Referring to FIGS. 1-3 and 15, in step 301 of embodiment method 300, at least one semiconductor integrated circuit (IC) die 105 may be mounted over a first side surface 102 of an interposer 103, 230. Referring to FIGS. 7A, 7B and 15, in step 303 of embodiment method 300, at least one semiconductor device 112 may be mounted over a second side surface 104 of the interposer 103, 230. Referring to FIGS. 9A-10B and 15, in step 305 of embodiment method 300, at least one recess 205 may be formed in a front side surface 202 of a package substrate 201. Referring to FIGS. 11A-11H and 15, in step 307 of embodiment method 300, at least one channel 260 may be formed in a bottom surface of a recess 205 in the front side surface 202 of the package substrate 201. Referring to FIGS. 12 and 15, in step 309 of embodiment method 300, the second side surface 104 of the interposer 103, 230 may be bonded to the front side surface 202 of the package substrate 201 such that each semiconductor device 112 overlies a recess 205 in the front side surface 202 of the package substrate 201. Referring to FIGS. 13-15 in step 311 of embodiment method 300, an underfill material portion 211 may be provided between the front side surface 202 of the package substrate 201 and the second side surface 104 of the interposer 103, 230 such that the underfill material portion 211 is located between a lower surface of each semiconductor device 112 and a bottom surface of a recess 205 in the front side surface 202 of the package substrate 201 underlying the respective semiconductor device 112, and the underfill material portion 211 is located in the at least one channel 260.

Referring to all drawings and according to various embodiments of the present disclosure, a semiconductor package 100, 200 may include an interposer 103, 230, at least one semiconductor integrated circuit (IC) die 105 mounted over a first side surface 102 of the interposer 103, 230, a semiconductor device 112 mounted over a second side surface 104 of the interposer 103, 230 that is opposite the first side surface 102 of the interposer 103, 230, and a package substrate 201 including a recess 205 in a front side surface 202 of the package substrate 201 and at least one channel 260 in a bottom surface of the recess 205, the second side surface 104 of the interposer 103, 230 bonded to the front side surface 202 of the package substrate 201 such that the semiconductor device 112 overlies the recess 205 and the at least one channel 260 in the front side surface 202 of the package substrate 201.

In an embodiment, the semiconductor package 100, 200 includes an underfill material portion 211 between the front side surface 202 of the package substrate 201 and the second side surface 104 of the interposer 103, 230 and within a gap 209 between a lower surface of the semiconductor device 112 and the bottom surface of the recess 205 in the front side surface 202 of the package substrate 201 and within the at least one channel 260 in the bottom surface of the recess 205. In another embodiment, a height of the gap 209 between the lower surface of the semiconductor device 112 and the bottom surface of the recess 205 in the front side surface 202 of the package substrate 201 is at least 5 µm. In another embodiment, the semiconductor device 112 is spaced from the package substrate 201. In another embodiment, a depth of the recess 205 from the front side surface 202 of the package substrate 201 is at least 5 µm. In another embodiment, the depth of the recess 205 from the front side surface 202 of the package substrate 201 is equal to or greater than 10 µm and less than or equal to 100 µm. In another embodiment, a ratio of the depth of the recess 205 to a total thickness of the package substrate 201 is between 0.0067 and 0.16. In another embodiment, the semiconductor device 112 has a length dimension along a first horizontal direction that is at least 300 µm, and the recess 205 has a length dimension along the first horizontal direction that is at least 50 µm greater than the length dimension of the semiconductor device 112 along the first horizontal direction. In another embodiment, a plurality of semiconductor IC dies 105 are bonded to the first side surface 102 of the interposer 103, 230 via semiconductor die bonding structures 119, a plurality of semiconductor devices 112 are bonded to the second side surface 104 of the interposer via second semiconductor device bonding structures 113, each of the plurality of semiconductor devices 112 including at least one circuit element located on or in the semiconductor device 112, and each of the plurality of semiconductor devices 112 is electrically coupled to at least one semiconductor IC die via interconnect structures extending through the interposer 103, 230, the package substrate 201 includes a plurality of recesses 205 in the front side surface 202 of the package substrate 201, each recess 205 of the plurality of recesses 205 including at least one channel 260 in a bottom surface of the recess 205, where each semiconductor device 112 of the plurality of semiconductor devices 112 bonded to the second side surface 104 of the interposer 103, 230 overlies a respective recess 205 and at least one channel 260 on the front side surface 202 of the package substrate 201, the package substrate comprises a plurality of solder material portions 207 located between respective bonding pads 115 of the second side surface 104 of the interposer 103, 230 and interconnect structures 204 of the package substrate 201, and the underfill material portion 211 laterally surrounds and contacts the solder material portions 207 and the semiconductor device bonding structures 113 and is located within each gap 209 between a lower surface of a semiconductor device 112 of the plurality of semiconductor devices 112 and a bottom surface of a recess 205 of the plurality of recesses 205 in the front side surface 202 of the package substrate 201. In another embodiment, the plurality of semiconductor IC dies 105 includes at least one of a system-on-chip (SoC) die and a high bandwidth memory (HBM) die, and wherein at least one semiconductor device 112 of the plurality of semiconductor devices 112 functions as a capacitor to improve signal integrity of the one or more semiconductor IC dies 105. In another embodiment, the at least one channel 260 has a width dimension WC that is less than a corresponding width dimension of the recess 205 in the front side surface 202 of the package substrate 201, has a length dimension LC that is less than, equal to, or greater than a corresponding length dimension of the recess 205 in the front side surface 202 of the package substrate 201, and has a maximum depth dimension DC with respect to the bottom surface of the recess 205 in the front side surface 202 of the package substrate 201 that is at least 3 µm. In another embodiment, the at least one channel 260 extends outside of the boundaries of the recess 205 in the front side surface 202 of the package substrate 201.

An additional embodiment is drawn to a substrate 201 for a semiconductor package including a front side surface 202, a rear side surface 203, a plurality of redistribution structures 204 located between the front side surface 202 and the rear side surface 203 of the substrate 201, at least one recess 205 in the front side surface 202 of the substrate 201, the at least one recess 205 having a depth of at least 5 µm and a length dimension along at least one horizontal direction of at least 350 µm, and at least one channel 260 in a recess 205 in the front side surface 202 of the substrate 201, wherein a long axis direction of the at least one channel 260 is parallel with the front side surface 202 of the substrate 201 in a cross-section view. In an embodiment, the at least one channel 260 extends outside of the boundaries of the recess 205 in the front side surface 202 of the package substrate 201 in a top view. In an embodiment, a total thickness of the substrate 201 between the front side surface 202 and the rear side surface 203 is between 600 µm and 1,500 µm, and a ratio of a depth of the at least one recess 205 to a total thickness of the substrate 201 is between 0.0067 and 0.16. In another embodiment, the substrate 201 includes a substrate core 213, a redistribution layer 214 over the substrate core 213, and an outer coating layer 215 over the redistribution layer 214 that forms the front side surface 202 of the substrate 201, and the at least one recess 205 extends at least through the outer coating layer 215 and into the redistribution layer 214.

An additional embodiment is drawn to a method of fabricating a semiconductor package 100, 200 that includes mounting at least one semiconductor integrated circuit (IC) die 105 over a first side surface 102 of an interposer 103, 230, mounting at least one semiconductor device 112 over a second side surface 104 of the interposer 103, 230 that is opposite the first side surface 102, forming at least one recess 205 in a front side surface of a package substrate 201, forming at least one channel 260 in a bottom surface of each recess 205 of the at least one recess 205 in the front side surface 202 of the package substrate 201, bonding the second side surface 104 of the interposer 103, 230 to the front side surface 202 of the package substrate 201 such that each semiconductor device 112 overlies a recess 205 of the at least one recess 205 in the front side surface 202 of the package substrate 201, and providing an underfill material portion 211 between the front side surface 202 of the package substrate 201 and the second side surface 104 of the interposer 103, 230 such that the underfill material portion 211 is located between a lower surface of each semiconductor device 112 and a bottom surface of a recess 205 of the at least one recess 205 in the front side surface of the package substrate underlying the respective semiconductor device 112, and the underfill material portion 211 is located in the at least one channel 260. In an embodiment, the method further includes forming the interposer 103, 230 over a first carrier substrate 101, forming a plurality of interposer bonding structures 106 over the first side surface 102 of the interposer 103, 230, wherein a plurality of semiconductor IC dies 105 are mounted over the first side surface 102 of the interposer 103, 230 via the plurality of first interposer bonding structures 106, providing a first underfill material portion 107 between the first side surface 102 of the interposer 103, 230 and the underside surfaces of the plurality of semiconductor IC dies 105 and between the respective semiconductor IC dies 105, and forming a molding portion 109 laterally surrounding the plurality of semiconductor IC dies 105.

In another embodiment, the method further includes providing a second carrier substrate 111 over upper surfaces of the plurality of semiconductor IC dies 105, the first underfill material portion 107 and the molding portion 109, removing the first carrier substrate 101 from the second side surface 104 of the interposer 103, 230, forming semiconductor device bonding structures 113 over the second side surface 104 of the interposer 103, 230, where the at least one semiconductor device 112 is mounted over the second side surface 104 of the interposer 103, 230 via the semiconductor device bonding structures 113, forming a plurality of bonding pads 115 over the second side surface 104 of the interposer 103, 230, where the second side surface 104 of the interposer 103, 230 is bonded to the front side surface 202 of the package substrate 201 via a plurality of solder material portions 207 located between respective bonding pads 115 over the second side surface 104 of the interposer 103, 230 and redistribution structures 204 exposed through the front side surface 202 of the package substrate 201, and removing the second carrier substrate 111 from over the upper surfaces of the plurality of semiconductor IC dies 105, the first underfill material portion 107 and the molding portion 109.

In another embodiment, forming the at least one recess 205 in the front side surface 202 of the package substrate includes forming each recess 205 of the at least one recess 205 to have a greater horizontal cross-sectional area than a horizontal cross-section area of a semiconductor device 112 overlying the respective recess 205 of the at least recess 205 upon bonding of the second side surface 104 of the interposer 103, 230 to the front side surface 202 of the package substrate 201, and where forming the at least one channel 260 in a bottom surface of each recess of the at least one recess 205 in the front side surface 202 of the package substrate 201 includes forming the at least one channel 260 having a width dimension WC that is less than a corresponding width dimension of the recess 205 in which the at least one channel 260 is formed, a length dimension LC that is less than, equal to, or greater than a corresponding length dimension of the recess 205 in which the at least one channel 260 if formed, and a maximum depth dimension DC with respect to the bottom surface 205 of the recess 205 in which the at least one channel 260 is formed that is at least 3 µm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   an interposer;
   at least one semiconductor integrated circuit (IC) die mounted over a first side surface of the interposer;
   a semiconductor device mounted over a second side surface of the interposer that is opposite the first side surface of the interposer; and
   a package substrate comprising a recess in a front side surface of the package substrate and at least one channel in a bottom surface of the recess, the second side surface of the interposer bonded to the front side surface of the package substrate such that the semiconductor device overlies the recess and the at least one channel in the front side surface of the package substrate and the semiconductor device is spaced from the at least one channel.

2. The semiconductor package of claim 1, further comprising:
   an underfill material portion between the front side surface of the package substrate and the second side surface of the interposer and within a gap between a lower surface of the semiconductor device and the bottom surface of the recess in the front side surface of the package substrate, and within the at least one channel and within the recess.

3. The semiconductor package of claim 1, wherein a height of the gap between the lower surface of the semiconductor device and the bottom surface of the recess is at least 5 µm.

4. The semiconductor package of claim 1, wherein the semiconductor device is spaced from the package substrate.

5. The semiconductor package of claim 1, wherein a depth of the recess from the front side surface of the package substrate to the bottom surface of the recess is at least 5 µm.

6. The semiconductor package of claim 5, wherein the depth of the recess from the front side surface of the package substrate is equal to or greater than 10 µm and less than or equal to 100 µm.

7. The semiconductor package of claim 1, wherein a ratio of a depth of the recess to a total thickness of the package substrate is between 0.0067 and 0.16.

8. The semiconductor package of claim 1, wherein the semiconductor device has a length dimension along a first horizontal direction that is at least 300 µm, and the recess has a length dimension along the first horizontal direction that is at least 50 µm greater than the length dimension of the semiconductor device along the first horizontal direction.

9. The semiconductor package of claim 2, wherein:
   a plurality of semiconductor IC dies are bonded to the first side surface of the interposer via semiconductor die bonding structures;

a plurality of semiconductor devices are bonded to the second side surface of the interposer via semiconductor device bonding structures, each of the plurality of semiconductor devices comprising at least one circuit element located on or in the semiconductor device, and each of the plurality of semiconductor devices is electrically coupled to at least one semiconductor IC die via interconnect structures extending through the interposer;

the package substrate comprises a plurality of recesses in the front side surface of the package substrate, each recess of the plurality of recesses including at least one channel in a bottom surface of the recess, wherein each semiconductor device of the plurality of semiconductor devices bonded to the second side surface of the interposer overlies a respective recess and at least one channel on the front side surface of the package substrate;

the package substrate comprises a plurality of solder material portions located between respective bonding pads of the second side surface of the interposer and interconnect structures of the package substrate; and the underfill material portion laterally surrounds and contacts the solder material portions and the semiconductor device bonding structures and is located within each gap between a lower surface of a semiconductor device of the plurality of semiconductor devices and a bottom surface of a recess of the plurality of recesses in the front side surface of the package substrate.

10. The semiconductor package of claim 9, wherein the plurality of semiconductor IC dies comprises at least one of a system-on-chip (SoC) die and a high bandwidth memory (HBM) die, and wherein at least one semiconductor device of the plurality of semiconductor devices comprises a capacitor to improve signal integrity of the one or more semiconductor IC dies.

11. The semiconductor package of claim 1, wherein the at least one channel has a width dimension that is less than a corresponding width dimension of the recess in the front side surface of the package substrate, and has a length dimension that is less than, equal to, or greater than a corresponding length dimension of the recess in the front side surface of the package substrate.

12. The semiconductor package of claim 1, wherein the at least one channel extends outside of the boundaries of the recess in the front side surface of the package substrate.

13. A substrate for a semiconductor package, comprising:
a front side surface;
a rear side surface;
a plurality of redistribution structures located between the front side surface and the rear side surface of the substrate;
at least one recess in the front side surface of the substrate, the at least one recess having a depth of at least 5 μm and a length dimension along at least one horizontal direction of at least 350 μm; and
at least one channel in the at least one recess in the front side surface of the substrate, wherein a long axis direction of the at least one channel is parallel with the front side surface of the substrate in a cross-section view.

14. The substrate of claim 13, wherein the at least one channel extends outside of the boundaries of the recess in the front side surface of the package substrate in a top view.

15. The substrate of claim 13, wherein a total thickness of the substrate between the front side surface and the rear side surface is between 600 μm and 1,500 μm, and a ratio of a depth of the at least one recess to a total thickness of the substrate is between 0.0067 and 0.16.

16. The substrate of claim 13, wherein the substrate comprises a substrate core, a redistribution layer over the substrate core, and an outer coating layer over the redistribution layer that forms the front side surface of the substrate, and the at least one recess extends at least through the outer coating layer and into the redistribution layer.

17. The semiconductor package of claim 1, wherein the at least one channel has a maximum depth dimension with respect to the bottom surface of the recess in the front side surface of the package substrate that is at least 3 μm.

18. The semiconductor package of claim 1, wherein the at least one channel has a width dimension that is at least 5 μm.

19. The substrate of claim 13, wherein the at least one channel has a maximum depth dimension with respect to the bottom surface of the recess in the front side surface of the package substrate that is at least 3 μm.

20. A semiconductor package, comprising:
an interposer;
at least one semiconductor integrated circuit (IC) die mounted over a first side surface of the interposer;
a semiconductor device mounted over a second side surface of the interposer that is opposite the first side surface of the interposer; and
a package substrate, the second side surface of the interposer mounted over a front side of the package substrate, the package substrate comprising a recess in the front side of the package substrate having a greater horizontal cross-sectional area than a horizontal cross-section area of the semiconductor device, the recess comprises at least one channel in a bottom surface of the recess, and a width dimension of the semiconductor device along a first horizontal direction is greater than a width dimension of the channel along the first horizontal direction.

* * * * *